United States Patent
Lee et al.

(10) Patent No.: US 10,371,983 B2
(45) Date of Patent: Aug. 6, 2019

(54) DISPLAY DEVICE

(71) Applicant: LG Display Co., Ltd., Seoul (KR)

(72) Inventors: Se-Min Lee, Seoul (KR); Hyeok-Joon Yoon, Paju-si (KR); Ju-Sang Rhim, Seoul (KR); Dae-Yong Kim, Goyang-si (KR); Eun-Hee Choi, Siheung-si (KR); Se-Jin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/659,287

(22) Filed: Jul. 25, 2017

(65) Prior Publication Data

US 2018/0031907 A1    Feb. 1, 2018

(30) Foreign Application Priority Data

Jul. 26, 2016   (KR) .................. 10-2016-0094627
Dec. 14, 2016   (KR) .................. 10-2016-0170725

(51) Int. Cl.
    *G09G 3/04*        (2006.01)
    *G02F 1/1335*      (2006.01)
                (Continued)

(52) U.S. Cl.
    CPC .. *G02F 1/133512* (2013.01); *G02F 1/133502* (2013.01); *G02F 1/133504* (2013.01);
                   (Continued)

(58) Field of Classification Search
    CPC ............. G02F 1/1335; G02F 1/133502; G02F 1/133504; G02F 1/133512; G02F 1/195; G02F 2001/1635; H01L 27/32

See application file for complete search history.

(56) References Cited

U.S. PATENT DOCUMENTS 5,521,726 A *   5/1996   Zimmerman ........ G02B 5/3025
                                                                        349/159
6,906,452 B2     6/2005   Ichikawa
                          (Continued)

FOREIGN PATENT DOCUMENTS

JP        2003-066206 A     3/2003
JP        2003-202415 A     7/2003
               (Continued)

OTHER PUBLICATIONS

European Patent Office, Extended European Search Report and Opinion, EP Patent Application No. 17204432.3, dated May 16, 2018, nine pages.

(Continued)

*Primary Examiner* — Joe H Cheng
(74) *Attorney, Agent, or Firm* — Fenwick & West LLP

(57) ABSTRACT

A display device includes a display panel including a plurality of pixels each having a plurality of sub-pixels; and a light path adjustment film on the display panel, wherein the light path adjustment film includes a first base film, and a pattern layer on a surface of the first base film, wherein the pattern layer includes a plurality of first patterns having a first refractive index, and a plurality of second patterns between the first patterns and having a second refractive index less than the first refractive index, and wherein the first pattern includes a top surface spaced apart from the display panel and parallel with the display panel, a bottom surface between the top surface and the display panel, and a slanted surface connecting the top surface and the bottom surface.

22 Claims, 18 Drawing Sheets

(51) Int. Cl.
*G02F 1/1362* (2006.01)
*H01L 27/32* (2006.01)
*H01L 51/52* (2006.01)
*G02F 1/163* (2006.01)
*G02F 1/19* (2019.01)

(52) U.S. Cl.
CPC ........ *G02F 1/136286* (2013.01); *H01L 27/32* (2013.01); *H01L 27/3211* (2013.01); *H01L 51/5275* (2013.01); *G02F 1/195* (2013.01); *G02F 2001/1635* (2013.01); *H01L 27/3244* (2013.01)

(56) References Cited

U.S. PATENT DOCUMENTS

| | | | | |
|---|---|---|---|---|
| 6,911,773 | B2* | 6/2005 | Seki | H01L 27/3246 |
| | | | | 313/498 |
| 7,012,367 | B2* | 3/2006 | Seki | H01L 27/3246 |
| | | | | 257/72 |
| 7,199,930 | B2* | 4/2007 | Yao | G02B 3/0031 |
| | | | | 349/112 |
| 8,213,082 | B2 | 7/2012 | Gaides et al. | |
| 8,827,474 | B2 | 9/2014 | Yamamoto et al. | |
| 8,917,962 | B1* | 12/2014 | Nichol | G02B 6/0028 |
| | | | | 362/296.01 |
| 9,207,386 | B2* | 12/2015 | Kim | G02B 6/0053 |
| 9,335,449 | B2 | 5/2016 | Gaides et al. | |
| 9,431,633 | B2* | 8/2016 | Park | H01L 51/52 |
| 9,804,311 | B2 | 10/2017 | Gaides et al. | |
| 2004/0061944 | A1* | 4/2004 | Kashima | G02B 5/021 |
| | | | | 359/599 |
| 2004/0080264 | A1 | 4/2004 | Ichikawa | |
| 2005/0018303 | A1 | 1/2005 | Harada | |
| 2005/0242709 | A1* | 11/2005 | Yamauchi | H01L 51/5271 |
| | | | | 313/498 |
| 2006/0012739 | A1 | 1/2006 | Shibazaki | |
| 2008/0225201 | A1* | 9/2008 | Hoshi | G02F 1/133606 |
| | | | | 349/62 |
| 2009/0116107 | A1* | 5/2009 | Kindler | G02B 26/123 |
| | | | | 359/457 |
| 2010/0214506 | A1 | 8/2010 | Gaides et al. | |
| 2010/0245738 | A1 | 9/2010 | Nishihara et al. | |
| 2010/0271721 | A1 | 10/2010 | Gaides et al. | |
| 2011/0043542 | A1 | 2/2011 | Kashiwagi et al. | |
| 2011/0261290 | A1* | 10/2011 | Kim | G02B 6/0021 |
| | | | | 349/64 |
| 2012/0049724 | A1* | 3/2012 | Nakai | H01L 51/0096 |
| | | | | 313/498 |
| 2012/0068596 | A1* | 3/2012 | Inoue | G02B 5/0231 |
| | | | | 313/504 |
| 2012/0162966 | A1* | 6/2012 | Kim | G02F 1/133606 |
| | | | | 362/97.1 |
| 2012/0224355 | A1 | 9/2012 | Umenaka | |
| 2012/0250350 | A1* | 10/2012 | Kim | G02F 1/133603 |
| | | | | 362/606 |
| 2013/0094174 | A1 | 4/2013 | Yamamoto et al. | |
| 2014/0253843 | A1* | 9/2014 | Kanno | G02B 5/0242 |
| | | | | 349/62 |
| 2015/0042935 | A1* | 2/2015 | Yamamoto | G02B 5/0231 |
| | | | | 349/112 |
| 2016/0133673 | A1* | 5/2016 | Kim | H01L 27/322 |
| | | | | 257/40 |
| 2016/0139453 | A1 | 5/2016 | Yui et al. | |
| 2016/0187564 | A1 | 6/2016 | Kim et al. | |
| 2016/0209577 | A1* | 7/2016 | Ford | G02B 6/0036 |
| 2016/0216420 | A1 | 7/2016 | Gaides et al. | |
| 2016/0372528 | A1* | 12/2016 | Kamura | H01L 51/0096 |
| 2017/0192137 | A1* | 7/2017 | Sakano | B29D 11/00798 |

FOREIGN PATENT DOCUMENTS

| | | |
|---|---|---|
| JP | 2003-282260 A | 10/2003 |
| JP | 2004-241214 A | 8/2004 |
| JP | 2011-501219 A | 1/2011 |
| JP | 2014-059565 A | 4/2014 |
| JP | 2014-106249 A | 6/2014 |
| JP | 2015-004711 A | 1/2015 |
| TW | I238432 B | 8/2005 |
| TW | 201545885 A | 12/2015 |
| WO | WO 2011-068072 A1 | 6/2011 |
| WO | WO 2011-162013 A1 | 12/2011 |
| WO | WO 2015/146708 A1 | 10/2015 |

OTHER PUBLICATIONS

Taiwan Intellectual Property Office, First Office Action, TW Patent Application No. 106140773, dated Aug. 22, 2018, 15 pages.
Japan Patent Office, Notification of Reasons for Refusal, JP Patent Application No. JP 2017-236075, dated Oct. 22, 2018, 11 pages.
Japan Patent Office, Office Action, JP Patent Application No. 2017-236075, dated May 9, 2019, 18 pages.

\* cited by examiner

DISPLAY DEVICE

CROSS REFERENCE TO RELATED APPLICATIONS

The present application claims the priority benefit of Republic of Korea Patent Application No. 10-2016-0094627 filed on Jul. 26, 2016 and Republic of Korea Patent Application No. 10-2016-0170725 filed on Dec. 14, 2016, each of which are hereby incorporated by reference in its entirety for all purposes as if fully set forth herein.

BACKGROUND

Field of Technology

The present disclosure relates to a display device, and particularly, relates to a display device which includes a light path adjustment film on a display panel and can maintain a clear image and reduce a lattice-like pattern.

Discussion of the Related Art

Generally, flat display devices, such as a liquid crystal display device (LCD), a plasma display panel device (PDP), and an organic light emitting diode (OLED) display device, easily achieves high resolution and have various advantages as large-sized display devices.

The display device includes a display panel, which includes a plurality of pixels. The pixel includes sub-pixels displaying respective colors.

In detail, when the display panel is a liquid crystal display panel, it includes an array substrate, an upper substrate and a liquid crystal layer therebetween. The array substrate includes gate lines and data lines crossing each other to define sub-pixel regions, and a thin film transistor as a switching element in each sub-pixel region. The upper substrate includes a color filter and/or black matrix.

When the display panel is an organic light emitting diode display panel, it includes an array substrate and an upper protection substrate. The array substrate includes gate lines and data lines crossing each other to define sub-pixel regions, an organic light emitting diode in each sub-pixel region, and a thin film transistor as a switching element in each sub-pixel region to supply an electric signal to the organic light emitting diode.

FIG. 1 is a view illustrating an arrangement of sub-pixels of a display panel according to the related art.

Referring to FIG. 1, the display panel 11 includes a plurality of pixels P to display a color image, and each pixel P includes a red sub-pixel Pr, a blue sub-pixel Pb and a green sub-pixel Pg.

Each sub-pixel includes an opening region A1 and a non-opening region A2. The opening region A1 is a region where a light is output from each sub-pixel, and the non-opening region A2 is a region where a light is not output from each sub-pixel.

The non-opening regions A2 are recognized as a lattice-like pattern by a viewer and becomes a cause of degradation of display quality.

However, there is a limit to reduction of the non-display regions A2 of the sub-pixels Pr, Pg and Pb because of process margin. Various researches have been conducted in order to reduce the lattice-like pattern, but a phenomenon of the image being unclear such as an image blur has happened. Accordingly, a solution to maintain a clear image and reduce a lattice-like pattern is required.

Particularly, when viewing a virtual reality (VR) device, a lattice-like pattern and an image blur are more recognized, and a solution for this is required.

SUMMARY

Accordingly, the present disclosure is directed to a display device that substantially obviates one or more of the problems due to limitations and disadvantages of the related art.

An object of the present disclosure is to provide a display device that can maintain a clear image and reduce recognition of a lattice-like pattern.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present disclosure, as embodied and broadly described herein, a display device includes a display panel including a plurality of pixels each having a plurality of sub-pixels; and a light path adjustment film on the display panel, wherein the light path adjustment film includes a first base film, and a pattern layer on a surface of the first base film, wherein the pattern layer includes a plurality of first patterns having a first refractive index, and a plurality of second patterns between the first patterns and having a second refractive index less than the first refractive index, and wherein the first pattern includes a top surface spaced apart from the display panel and parallel with the display panel, a bottom surface between the top surface and the display panel, and a slanted surface connecting the top surface and the bottom surface.

In another aspect, a display device includes a display panel including a plurality of pixels each having a plurality of sub-pixels; and a light path adjustment film on the display panel, wherein the light path adjustment film includes a plurality of first pattern portions that have a first refractive index and a cylindrical shape, and a plurality of second pattern portions that have a second refractive index less than the first refractive index and are between the plurality of first pattern portions.

In another aspect, a display device includes a display panel including a plurality of pixels each having a plurality of sub-pixels; and a light path adjustment film on the display panel, wherein the light path adjustment film includes a first pattern layer and a second pattern layer on the first pattern layer, wherein each of the first and second pattern layers includes a plurality of first pattern portions that have a bar shape having a major axis and a minor axis, and a plurality of second pattern portions between the plurality of first pattern portions, wherein the first pattern portion includes a first surface of a trapezoidal shape, a second surface of a trapezoidal shape opposite to the first surface, a third surface connecting a bottom side of the first surface and a bottom side of the second surface, a fourth surface opposite to the third surface, and first and second slanted surfaces each connecting the third and fourth surfaces, wherein the first and second surfaces is arranged on the minor axis of the first pattern portion, and wherein the third and fourth surfaces, and the first and second slanted surfaces are arranged on the major axis of the first pattern portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

First Embodiment

Figure 1:
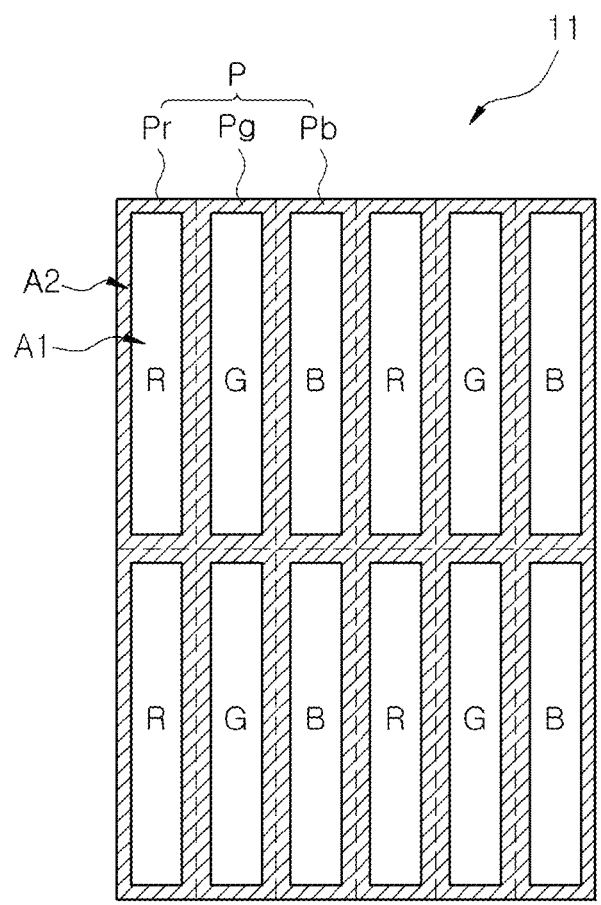
FIG. 1 is a view illustrating an arrangement of sub-pixels of a display panel according to the related art.
Figure 2:
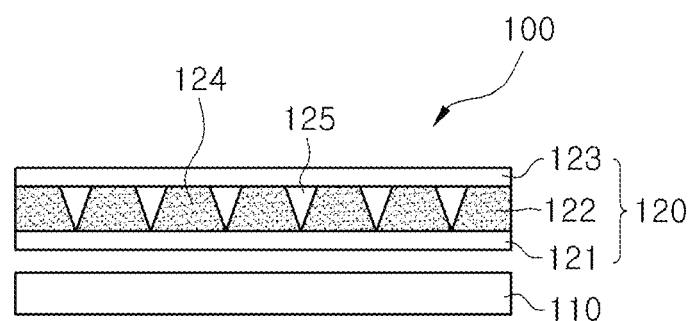
FIG. 2 is a schematic cross-sectional view illustrating a display device according to a first embodiment of the present disclosure.

FIG. 2 is a schematic cross-sectional view illustrating a display device according to a first embodiment of the present invention.

Referring to FIG. 2, the display device 100 includes a display panel 110, and a
light path adjustment film 120 on the display panel 110.

The light path adjustment film 120 includes a first base film 121, a second base film 123, and a pattern layer 122 between the first and second base films 121 and 123.

The second base film 123 may function to prevent scattering of an external light. Accordingly, when there is no influence of an external light (e.g., when an VR device is used), the second base film 123 may be eliminated from the display device 100.

The first base film 121 supports the pattern layer 122. The first base film 121 may contact the display panel 110 and protect the display panel 110 from a moisture or impact, and thus reliability can be achieved.

The pattern layer 122 may include a plurality of patterns 124 that have a first refractive index, and air gaps 125 that are between the patterns 124 and have a second refractive index less than the first refractive index. The air gap 125 is by way of example in this embodiment, and a material having a refractive index less than the first refractive index may be used.

Each of the first and second base films 121 and 123 may be made of a polyethylene terephthalate (PET), polycarbonate (PC), or acryl based material. The pattern layer 122 may be made of a polycarbonate (PC), or acryl based material.

The light path adjustment film 120 uses the pattern layer 122 to adjust a path of light from the display panel 110 in path and output the light.

Figure 3:
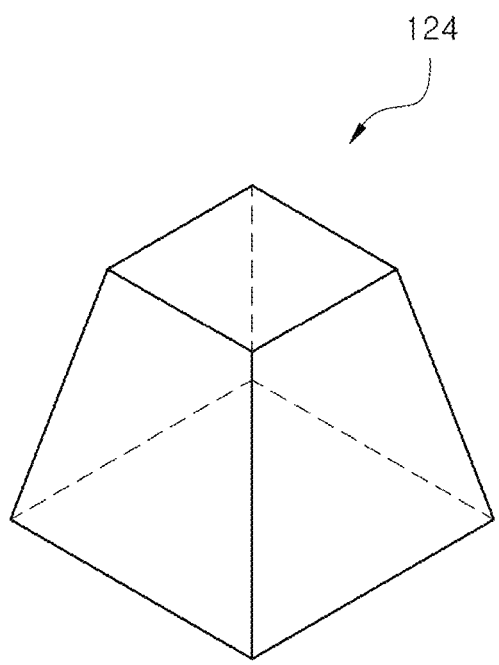
FIGS. 3 and 4 are views enlarging the pattern of the light path adjustment film according to the first embodiment of the present disclosure.
Figure 4:
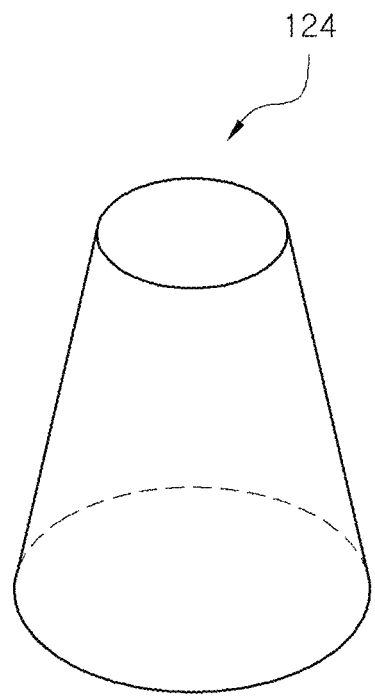

FIGS. 3 and 4 are views enlarging the pattern of the light path adjustment film according to the first embodiment of the present disclosure.

Referring to FIGS. 3 and 4, each pattern 124 of the pattern layer 122 may include a top surface that is spaced apart at a predetermined distance from the display panel 110 and parallel with the display panel 110, a bottom surface that is between the top surface and the display panel 110, and a slanted surface that connects the top surface and the bottom surface at a predetermined slanted angle. The pattern 124 may have, for example, a truncated quadrangular pyramid shape of FIG. 3, or a truncated cone shape of FIG. 4.

The pattern 124 may have other truncated polypyramid shape. In other words, the pattern 124 may be configured such that the top surface and the bottom surface of the pattern 124 are different in size to adjust a path of a light from the display panel 110.

Figure 5:
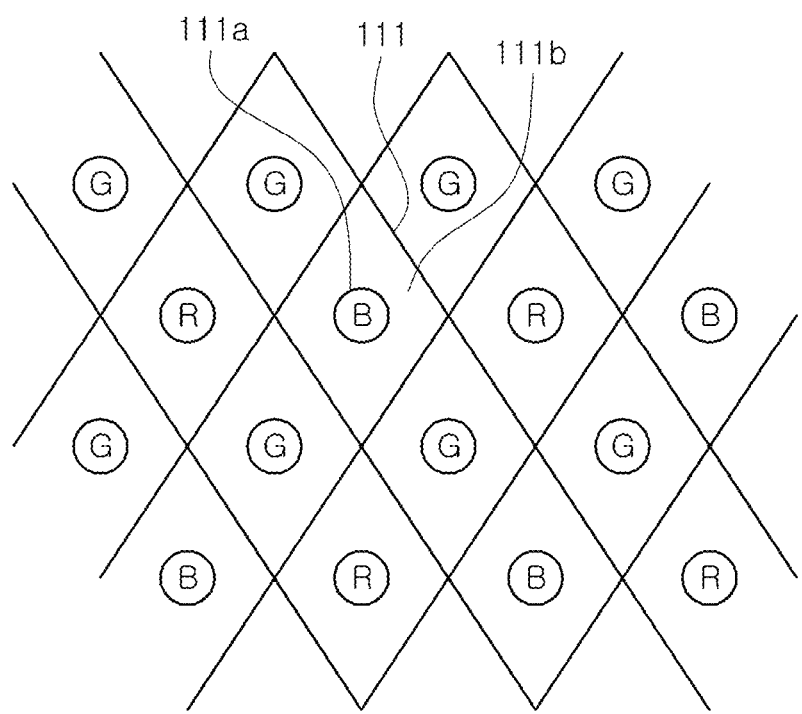
FIG. 5 is a schematic view illustrating an arrangement of the sub-pixels of the display panel according to the first embodiment of the present disclosure.

FIG. 5 is a schematic view illustrating an arrangement of the sub-pixels of the display panel according to the first embodiment of the present disclosure.

Referring to FIG. 5, a pentile structure may be used in which a red sub-pixel R and a blue sub-pixel B may be alternately arranged in a same column, and green sub-pixels G may be arranged in a neighboring column. However, other structure and arrangement may be used. Each sub-pixel 111 includes an opening region 111a and a non-opening region 111b.

The opening region 111a is a region where light is output from each sub-pixel 111, and the non-opening region 111b is a region where light is not output from each sub-pixel 111.

The non-opening regions 111b are recognized as a lattice-like pattern by a viewer and becomes a cause of degradation of display quality. However, since the non-opening region 111b are regions where the gate and data lines and the thin film transistors to operate the sub-pixels 111 are formed, there is a limit to reduction of the non-display regions 111b because of process margin.

Figure 6A:
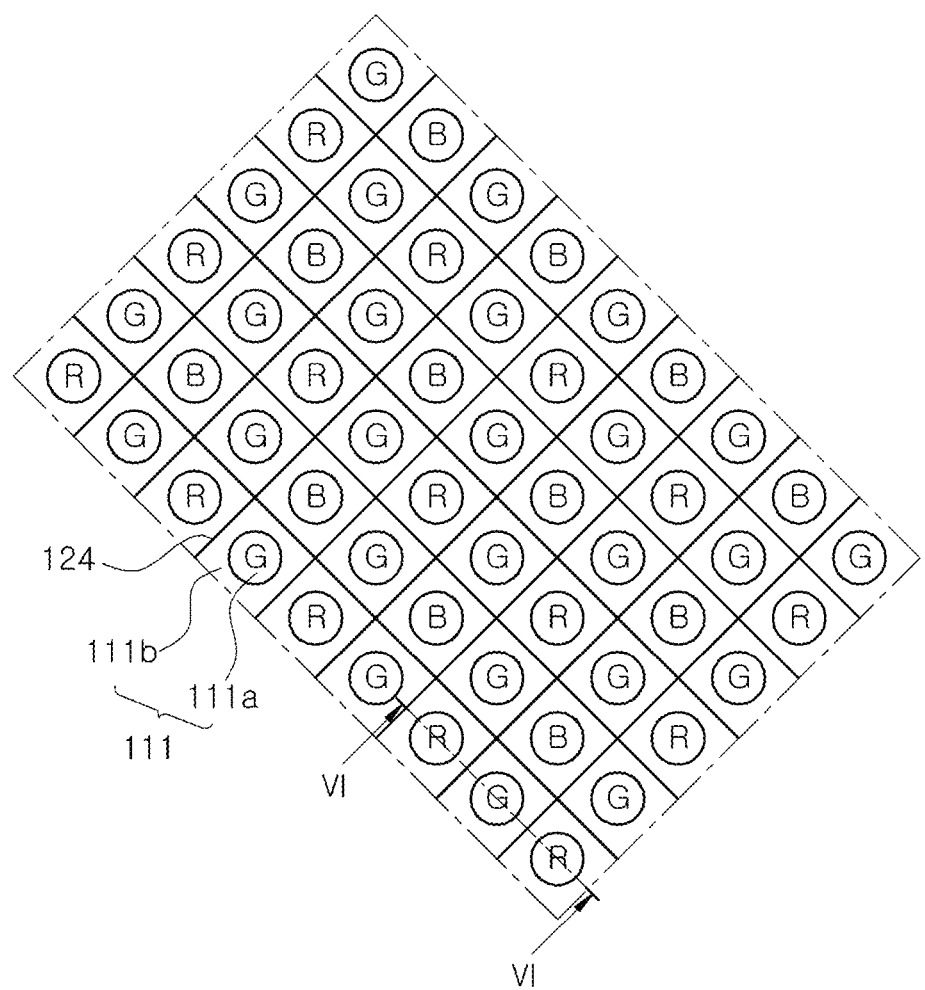
FIG. 6A is a schematic plan view illustrating the display device according to the first embodiment of the present disclosure.

FIG. 6A is a schematic plan view illustrating the display device according to the first embodiment of the present disclosure.

Referring to FIG. 6A, in the sub-pixel arrangement of the pentile structure, the light path adjustment film 120 may be configured such that the patterns 124 of the truncated quadrangular pyramid shape correspond to the respective sub-pixels 111. Each sub-pixel 111 includes the opening region 111a and the non-opening region 111b.

Figure 6B:
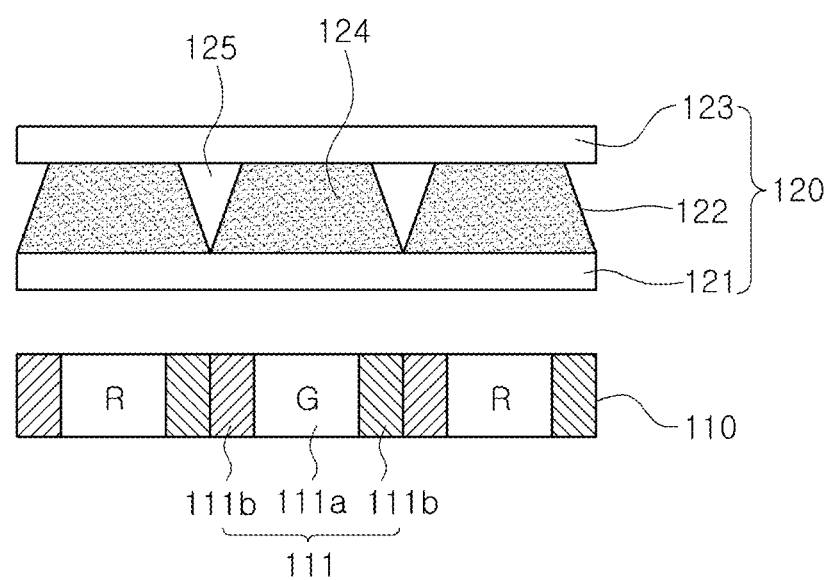
FIG. 6B is a schematic cross-sectional view taken along a line VI-VI of FIG. 6A according to the first embodiment of the present disclosure.

FIG. 6B is a schematic cross-sectional view taken along a line VI-VI of FIG. 6A.

Referring to FIG. 6B, the light path adjustment film 120 is located on the display panel 110.

The light path adjustment film 120 may include the first base film 121, the second base film 123, and the pattern layer 122 between the first and second base films 121 and 123.

The pattern layer 122 may include the plurality of patterns 124 and the plurality of air gaps 125, and each pattern 124 may correspond to each sub-pixel 111.

In detail, each pattern 124 may has a shape such that the pattern 124 includes a top surface that is spaced apart at a predetermined distance from the display panel 110 and parallel with the display panel 110, a bottom surface that is between the top surface and the display panel 110, and a slanted surface that connects the top surface and the bottom surface at a predetermined slanted angle.

In this case, the top surface of the pattern 124 has an area greater than that of the opening region 111a of the sub-pixel 111 to prevent reduction of brightness of the sub-pixel 111. The bottom surface of the pattern 124 has an area greater than that of the top surface to adjust a light path by the slanted surface.

The area of the bottom surface of the pattern 124 is greater than the area of the opening region 111a and is equal to or less than the area of the sub-pixel 111, and the bottom surfaces of the patterns 124 does not overlap each other. Accordingly, each pattern 124 is arranged to correspond to each sub-pixel 111.

Figure 7A:
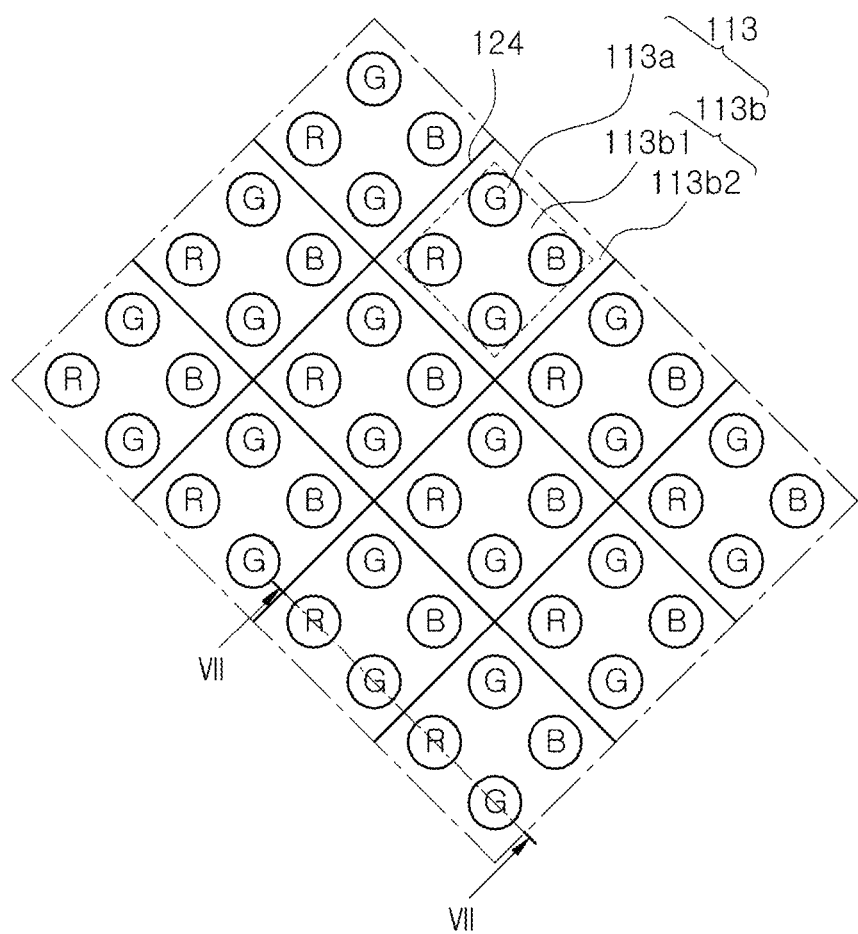
FIG. 7A is a schematic plan view illustrating another example of the display device according to the first embodiment of the present disclosure.

FIG. 7A is a schematic plan view illustrating another example of the display device according to the first embodiment of the present disclosure.

Referring to FIG. 7A, in the arrangement of the pixels 113 of the pentile structure, each pattern 124 of the light path adjustment film 120 may be arranged to correspond to each pixel 113.

Each pixel 113 may include opening regions 113a outputting a light and non-opening regions 113b not outputting a light. Each opening region 113a of the pixel 113 may be formed at each sub-pixel region of the pixel 113.

The non-opening regions 113b may include a second non-opening region 113b2 surrounding a peripheral portion of the opening regions 113a, and a first non-opening region 113b1 between the opening regions 113a.

Figure 7B:
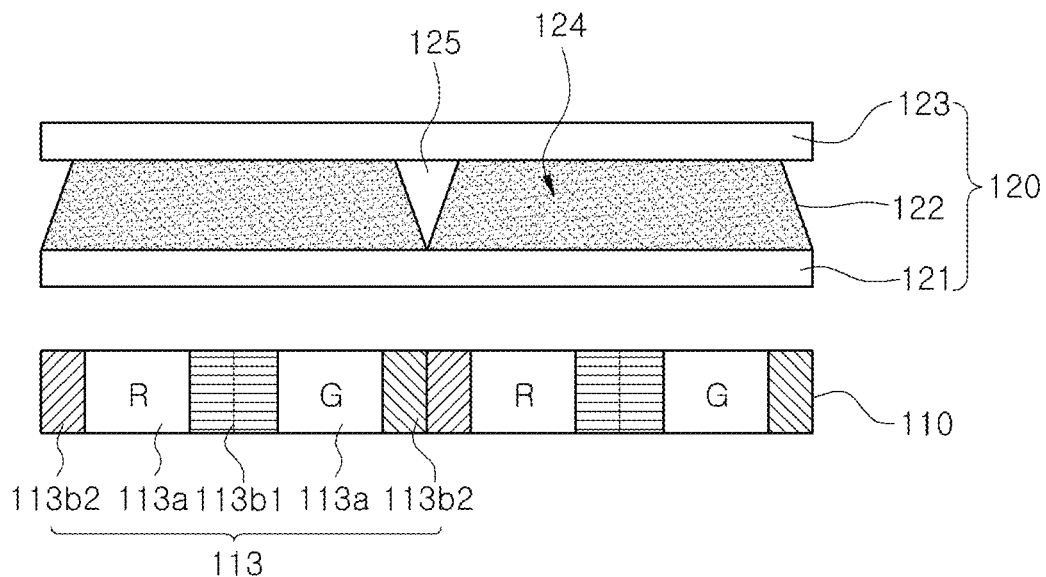
FIG. 7B is a schematic cross-sectional view taken along a line VII-VII of FIG. 7A according to the first embodiment of the present disclosure.

FIG. 7B is a schematic cross-sectional view taken along a line VII-VII of FIG. 7A.

Referring to FIG. 7B, the light path adjustment film 120 is located on the display panel 110.

The light path adjustment film 120 may include the first base film 121, the second base film 123, and the pattern layer 122 between the first and second base films 121 and 123.

The pattern layer 122 may include the plurality of patterns 124 and the plurality of air gaps 125, and each pattern 124 may correspond to each pixel 113.

In detail, each pattern 124 may has a shape such that the pattern 124 includes a top surface that is spaced apart at a predetermined distance from the display panel 110 and parallel with the display panel 110, a bottom surface that is between the top surface and the display panel 110, and a slanted surface that connects the top surface and the bottom surface at a predetermined slanted angle.

In this case, the top surface of the pattern 124 has an area greater than that of the opening regions 113a and the first non-opening region 113b1 of the pixel 113, to prevent reduction of brightness of the pixel 113. The bottom surface of the pattern 124 has an area greater than that of the top surface to adjust a light path by the slanted surface.

The area of the bottom surface of the pattern 124 is greater than the area of the opening regions 113a and the first non-opening region 113b1 of the pixel 113 and is equal to or less than the area of the pixel 113, and the bottom surfaces of the patterns 124 does not overlap each other. Accordingly, each pattern 124 is arranged to correspond to each pixel 113.

Figure 8:
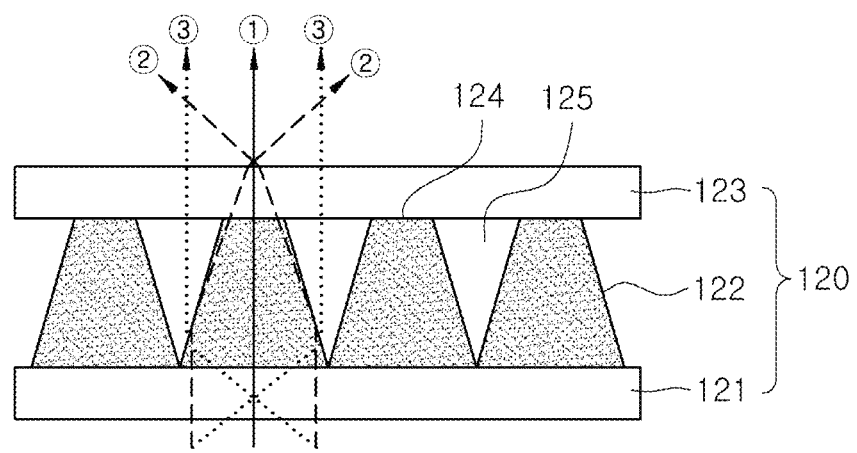
FIG. 8 is a view illustrating a light path through the light path adjustment film according to the first embodiment of the present disclosure.

FIG. 8 is a view illustrating a light path through the light path adjustment film according to the first embodiment of the present invention.

Referring to FIG. 8, a light input through the first base film 121 is adjusted in path while passing through the pattern 124 of the pattern layer 122 then passes through the second base film 123 and then is output.

In detail, a light, which is vertically input, from the opening region 111a of each sub-pixel 111, to a center portion of the bottom surface of the pattern 124, passes through the first base film 121, the pattern 124 and the second base film 123 without refraction and then is output as it is (e.g., a light path $\hat{1}$).

Light, which is input, from the opening region 111a of each sub-pixel 111, to the slanted surface via the bottom surface of the pattern 124, is totally reflected thus adjusted in path and is output to a region that corresponds to the non-opening region 111b of the sub-pixel 111 (e.g., a light path 2̂).

Light, which is input, from the opening region 111a of each sub-pixel 111, to the slanted surface of the pattern 124, is adjusted in path toward the second base film 123 because of a difference of refractive index between the air gap 125 and the pattern 124, and is output to a region that corresponds to the non-opening region 111b of the sub-pixel 111 (e.g., a light path 3̂).

Accordingly, when light from each sub-pixel 111 pass through the light path adjustment film 120, the light can be output to a region corresponding to the opening region 111a of the sub-pixel 111 and can also be adjusted in path and output to a region corresponding to the non-opening region 111b of the sub-pixel 111. Thus, a lattice-like pattern can be reduced, and a clear image can be maintained.

Figure 9:
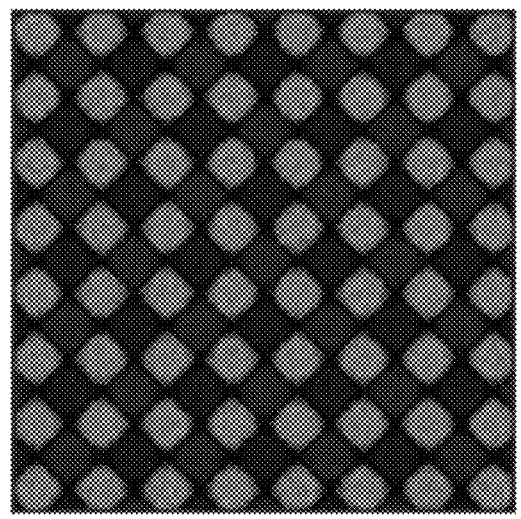
FIG. 9 is a picture of the display device according to the first embodiment of the present disclosure.

FIG. 9 is a picture of the display device according to the first embodiment of the present invention. Explanations of parts similar to parts of the previous embodiment can be omitted.

Referring to FIG. 9, since the display device 100 of this embodiment outputs lights from each sub-pixel 111 to regions corresponding to the opening region 111a and the non-opening region 111b of the sub-pixel 111 via the light path adjustment film 120, it is seen that a clear image is produced and a lattice-like pattern is reduced.

Second Embodiment

Figure 10:
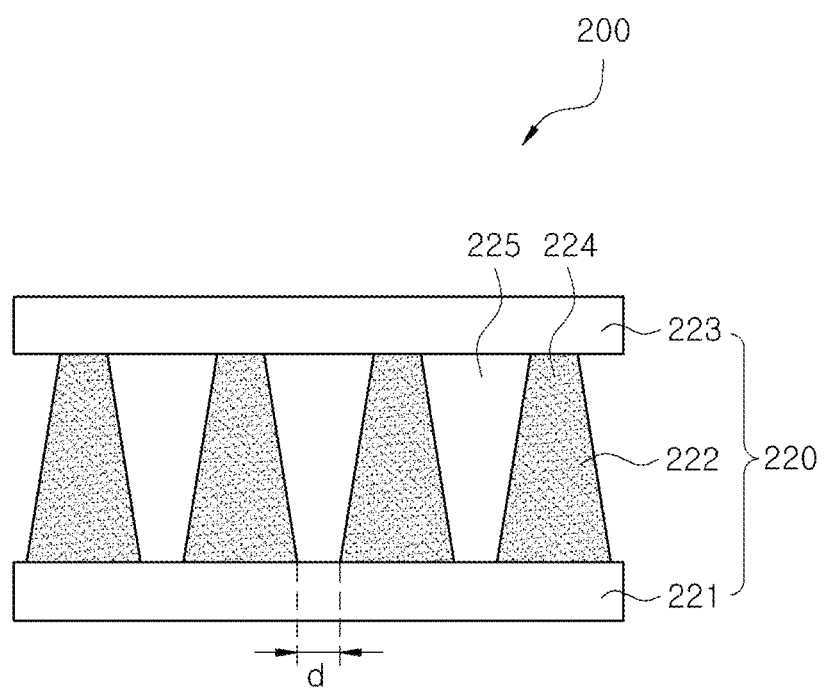
FIG. 10 is a schematic cross-sectional view illustrating a light path adjustment film according to a second embodiment of the present disclosure.

FIG. 10 is a schematic cross-sectional view illustrating a light path adjustment film according to a second embodiment of the present disclosure.

Referring to FIG. 10, the light path adjustment film 220 includes a first base film 221, a second base film 223, and a pattern layer 222 between the first and second base films 221 and 223.

The second base film 223 may function to prevent scattering of an external light. Accordingly, when there is no influence of an external light (e.g., when an VR device is used), the second base film 223 may be eliminated from the display device.

The first base film 221 may contact the display panel (e.g., 110 of FIG. 7B) and protect the display panel from a moisture or impact, and thus reliability can be achieved.

The pattern layer 222 may include a plurality of patterns 224 that have a first refractive index, and air gaps 225 that are between the patterns 224 and have a second refractive index less than the first refractive index. The air gap 225 is by way of example in this embodiment, and a material having a refractive index less than the first refractive index may be used.

Each of the first and second base films 221 and 223 may be made of a polyethylene terephthalate (PET), polycarbonate (PC), or acryl based material. The pattern layer 222 may be made of a polycarbonate (PC), or acryl based material.

Each pattern 224 of the pattern layer 222 may be formed such that the pattern 224 includes a top surface that is spaced apart at a predetermined distance from the display panel and parallel with the display panel, a bottom surface that is between the top surface and the display panel, and a slanted surface that connects the top surface and the bottom surface at a predetermined slanted angle.

In this embodiment, the bottom surfaces of the patterns 224 are spaced apart at a predetermined distance d from each other, differently than the first embodiment.

The top surface of the pattern 224 has an area greater than that of the opening region (e.g., 111a of FIG. 6B) of the sub-pixel (e.g., 111 of FIG. 6B) to prevent reduction of brightness of the sub-pixel. The bottom surface of the pattern 224 has an area greater than that of the top surface to adjust a light path by the slanted surface.

The area of the bottom surface of the pattern 224 is greater than the area of the opening region of the sub-pixel, and is less than the area of the sub-pixel in the light of the distance d between the bottom surfaces.

Third Embodiment

Figure 11:
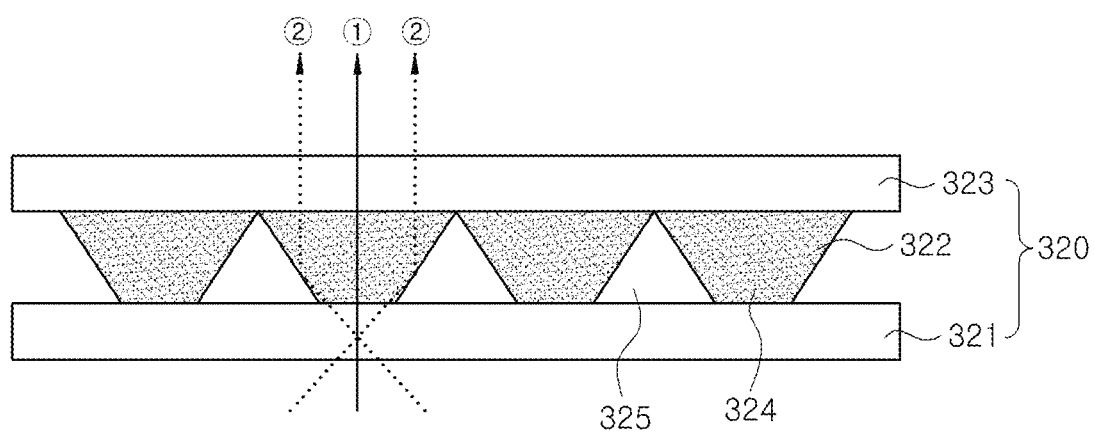
FIG. 11 is a schematic cross-sectional view illustrating a light path adjustment film according to a third embodiment of the present disclosure.

FIG. 11 is a schematic cross-sectional view illustrating a light path adjustment film according to a third embodiment of the present invention. Explanations of parts similar to parts of the previous embodiments can be omitted.

Referring to FIG. 11, each pattern 324 of the pattern layer 322 may has an inverted truncated polypyramid shape, for example, an inverted truncated quadrangular pyramid shape or inverted truncated cone shape, such that the pattern 324 includes a top surface that is spaced apart at a predetermined distance from the display panel (e.g., 110 of FIG. 7B) and parallel with the display panel, a bottom surface that is between the top surface and the display panel, and a slanted surface that connects the top surface and the bottom surface at a predetermined slanted angle.

In this embodiment, the bottom surface of the pattern 324 has an area greater than that of the opening region (e.g., 111a of FIG. 6B) of the sub-pixel (e.g., 111 of FIG. 6B) to prevent reduction of brightness of the sub-pixel. The top surface of the pattern 324 has an area greater than that of the bottom surface to adjust a light path by the slanted surface.

The area of the top surface of the pattern 324 is greater than the area of the opening region of the sub-pixel and is equal to or less than the area of the sub-pixel, and the top surfaces of the patterns 324 does not overlap each other.

In this embodiment, a light input through the first base film 321 is adjusted in path while passing through the pattern 324 of the pattern layer 322 then passes through the second base film 323 and then is output.

In detail, a light, which is input, from the opening region (e.g., 111a of FIG. 6B) of each sub-pixel (e.g., 111 of FIG. 6B), to the bottom surface of the pattern 324, passes through the first base film 321, the pattern 324 and the second base film 323 without refraction and then is output as it is (e.g., a light path 2̂).

Light, which is input, from the opening region of each sub-pixel, to the slanted surface of the pattern 324, is adjusted in path toward the second base film 323 because of a difference of refractive index between the air gap 325 and the pattern 324, and is output to a region that corresponds to the non-opening region (e.g., 111b of FIG. 6B) of the sub-pixel (e.g., a light path 2̂).

Accordingly, when light from each sub-pixel pass through the light path adjustment film 320, the light can be output to a region corresponding to the opening region of the sub-pixel and can also be adjusted in path and output to a region corresponding to the non-opening region of the sub-pixel. Thus, a lattice-like pattern can be reduced, and a clear image can be maintained.

Further, each pattern 324 may be arranged corresponding to each pixel (e.g., 113 of FIG. 7A).

The light path adjustment structure of this embodiment is a structure that effectively adjusts a light path by gently forming the slanted surface in case of manufacturing the light path adjustment film 320 in a thin film type.

Fourth Embodiment

Figure 12:
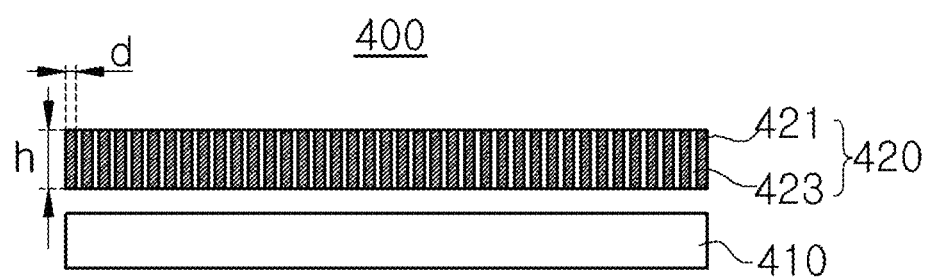
FIG. 12 is a schematic view illustrating a display device according to a fourth embodiment of the present disclosure.

FIG. 12 is a schematic view illustrating a display device according to a fourth embodiment of the present disclosure.

Referring to FIG. 12, the display device 400 includes a display panel 410 that includes a plurality of pixels each having sub-pixels, and a light path adjustment film 420 on the display panel 410.

The light path adjustment film 420 may include a plurality of first pattern portions 421 of a cylindrical shape that have a first refractive index, and a plurality of second pattern portions 423 that are between the first pattern portions 421 and have a second refractive index less than the first refractive index.

Alternatively, the light path adjustment film 420 may include a plurality of first pattern portions 421 of a cylindrical shape that have a first refractive index, and a plurality of second pattern portions 423 that are between the first pattern portions 421 and have a second refractive index greater than the first refractive index.

A case that the first refractive index of the first pattern portion 421 is greater than the second refractive index of the second pattern portion 423 is explained below.

The first pattern portion 421 has a cylindrical shape that has a size less than that of the sub-pixel. The cylindrical shape may has a diameter d of, for example, 10 um or less.

The second pattern portion 423 is located between the first pattern portions 421.

Accordingly, the light path adjustment film 420 includes the plurality of first pattern portions 421 of a cylindrical shape having the first refractive index, and the plurality of second pattern portions 423 that have the second refractive index less that the first refractive index of the first pattern portion 421 and are arranged between the first pattern portions 421.

The light path adjustment film 420 may be made of a polycarbonate (PC), or acryl based material.

The first pattern portion 421 may have a height of, for example, 120 um or less.

The display device 400 can adjust a path of a light from the display panel 410 using the light path adjustment film 420.

Figure 13:
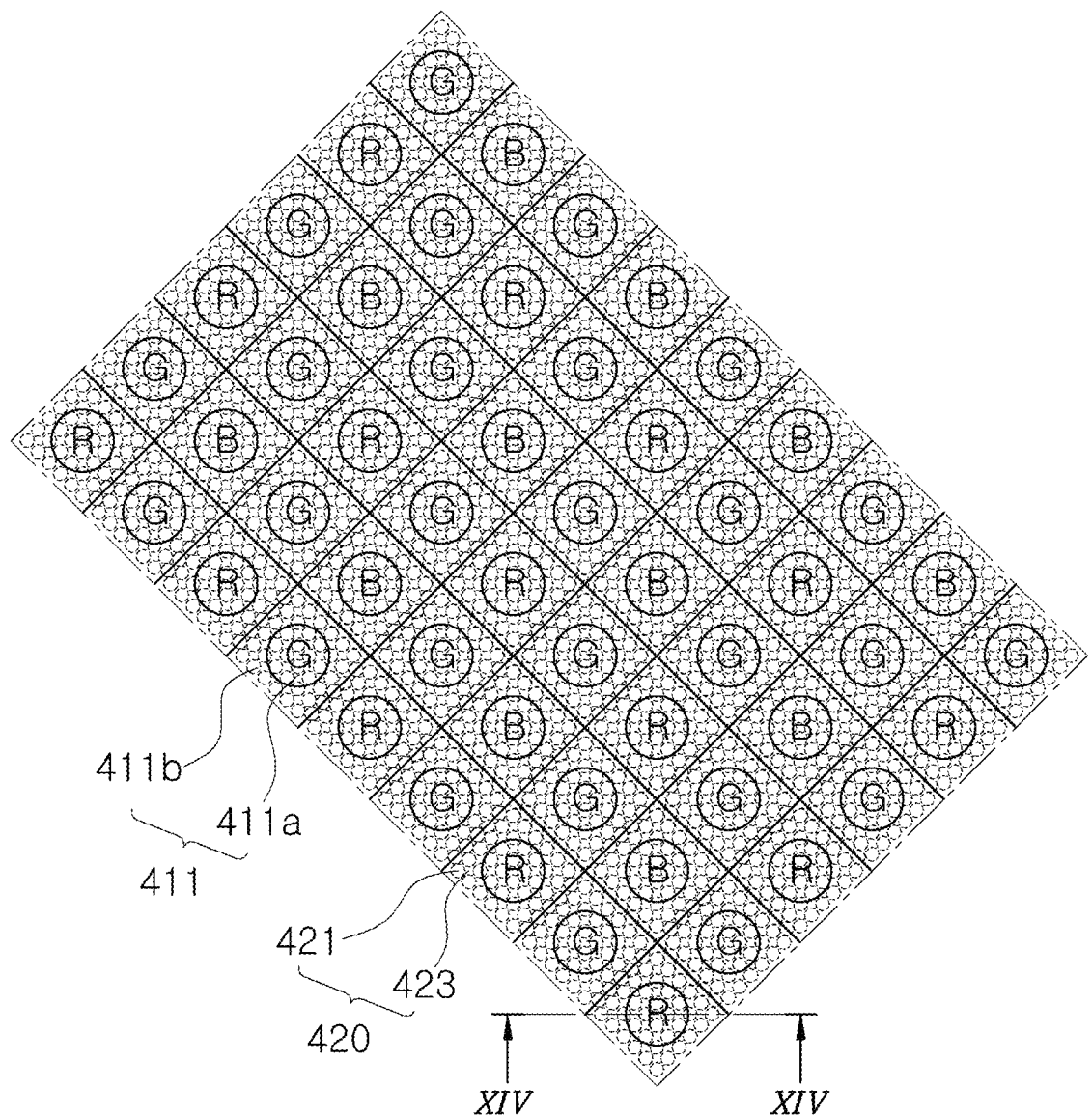
FIG. 13 is a schematic plan view illustrating the display device according to the fourth embodiment of the present disclosure.

FIG. 13 is a schematic plan view illustrating the display device according to the fourth embodiment of the present disclosure.

Referring to FIG. 13, in the sub-pixel arrangement of the pentile structure, the light path adjustment film 420 is located on the sub-pixels 411.

The plurality of first pattern portions 421 and the plurality of second pattern portions 423 are arranged to correspond to each sub-pixel 411.

Each sub-pixel 411 includes an opening region 411a and a non-opening region 411b.

As described above, the diameter d of the first pattern portion 421 may be less than that of the sub-pixel 411. The first pattern portions 421 may be arranged uniformly or non-uniformly.

Since the light path adjustment film 420 includes the first pattern portion 421 of a minute cylindrical shape, aligning between the opening region 411a of the sub-pixel 411 and the first pattern portion 421 of the light path adjustment film 420 is not needed. Thus, a manufacturing process can be simplified.

Figure 14:
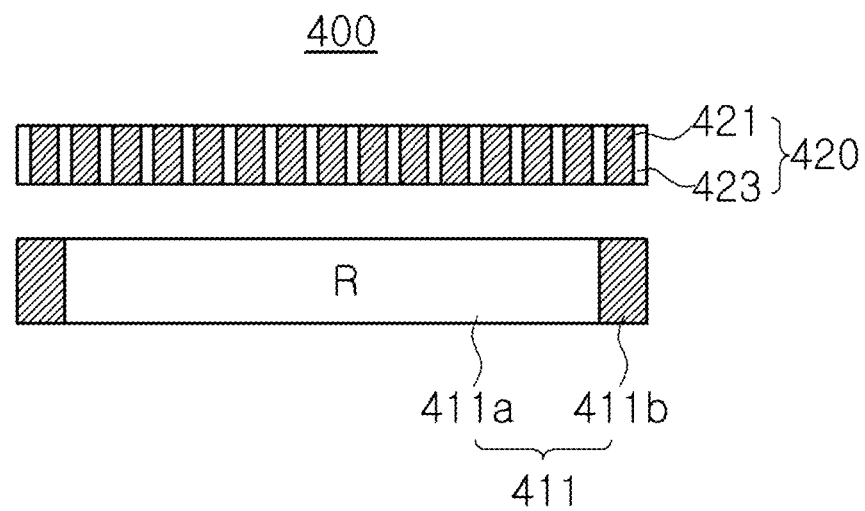
FIG. 14 is a cross-sectional view taken along a line XIV-XIV of FIG. 13 according to the fourth embodiment of the present disclosure.

FIG. 14 is a cross-sectional view taken along a line XIV-XIV of FIG. 13.

Referring to FIG. 14, the light path adjustment film 420 is located on the sub-pixel 411.

The light path adjustment film 420 includes the plurality of first pattern portions 421 and the plurality of second pattern portions 423 arranged on the sub-pixel 411.

The first pattern portions 421 have a minute cylindrical shape, and the second pattern portions 423 of the second refractive index less that the first refractive index are arranged between the first pattern portions 421.

The plurality of first pattern portions 421 and the plurality of second pattern portions 423 correspond to each sub-pixel 411.

Figure 15:
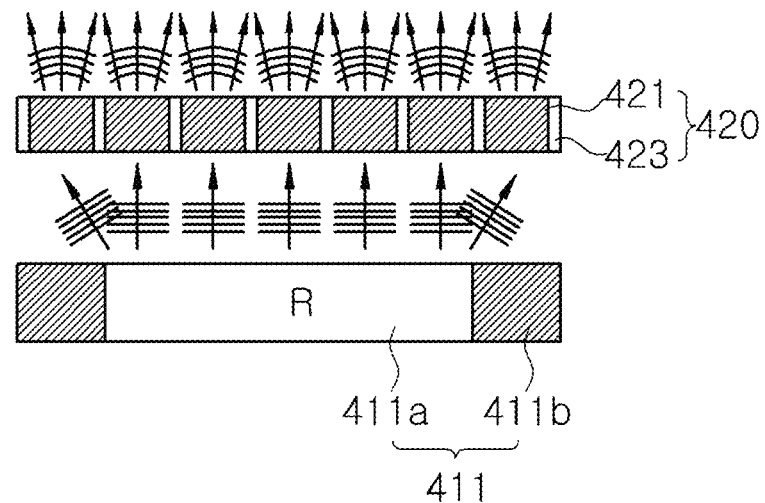
FIG. 15 is a view illustrating a light path through the light path adjustment film according to the fourth embodiment of the present disclosure.

FIG. 15 is a view illustrating a light path through the light path adjustment film according to the fourth embodiment of the present invention.

Referring to FIG. 15, the non-opening region 411b of the sub-pixel does not output light. Light from the opening region 411a is diffracted while passing through the minute first pattern portions 421 and thus light output range is expanded.

In other words, when the first pattern portion 421 has a minute width that is close to a wavelength of light, light output from the opening region 411a is diffracted while passing through the first pattern portion 421, and a light output range is expanded.

When the width of the first pattern portion is greater than a wavelength of a light, light output from the opening region 411a may be refracted while passing through the first pattern portion 421 and thus light output range may be expanded.

In other words, light input to the first pattern portion 421 is mostly totally reflected and travels in the first pattern portion 421 because of a difference of a refractive index between the first pattern portion 421 and the second pattern portion 423, and while passing through the first pattern portion 421, the light is diffracted or refracted toward a side direction and thus a light output range may be expanded.

Accordingly, when light from each sub-pixel 411 pass through the light path adjustment film 420, the light can be output to a region corresponding to the opening region 411a of the sub-pixel 411 and can also be adjusted in path and output to a region corresponding to the non-opening region 411b of the sub-pixel 411. Thus, a lattice-like pattern can be reduced, and a clear image can be maintained.

Figure 16A:
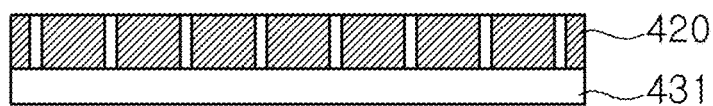
FIGS. 16A to 16C are views of another examples of light path adjustment films according to the fourth embodiment of the present disclosure.
Figure 16B:
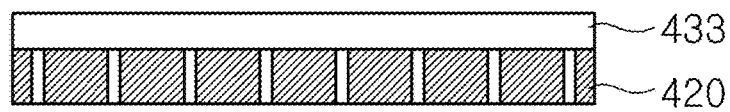
Figure 16C:
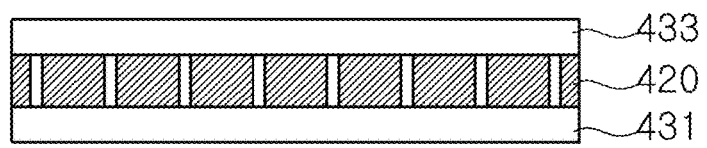

FIGS. 16A to 16C are views of other examples of light path adjustment films according to the fourth embodiment of the present disclosure.

Referring to FIG. 16A, a first base film 431 may be located at a bottom of the light path adjustment film 420.

The first base film 431 supports the light path adjustment film 420. The first base film 431 may contact the display panel 410 and protect the display panel 410 from a moisture or impact, and thus reliability can be achieved.

Referring to FIG. 16B, a second base film 433 may be located at a top of the light path adjustment film 420.

Referring to FIG. 16C, the first base film 431 and the second base film 433 may be located at the bottom and the top of the light path adjustment film 420.

Each of the first and second base films 431 and 433 may be made of a polyethylene terephthalate (PET), polycarbonate (PC), or acryl based material.

As described above, in the display device 400 of this embodiment, the light path adjustment film 420 including the minute-sized first pattern portions 421 and the second pattern portions 423 are employed, and a light output from the opening region 411a of each sub-pixel 411 can be expanded over the non-opening region 411b.

Accordingly, regarding a VR device that eyes of a viewer watch closely, a lattice-like pattern and an image blur can be effectively improved.

Figure 17A:
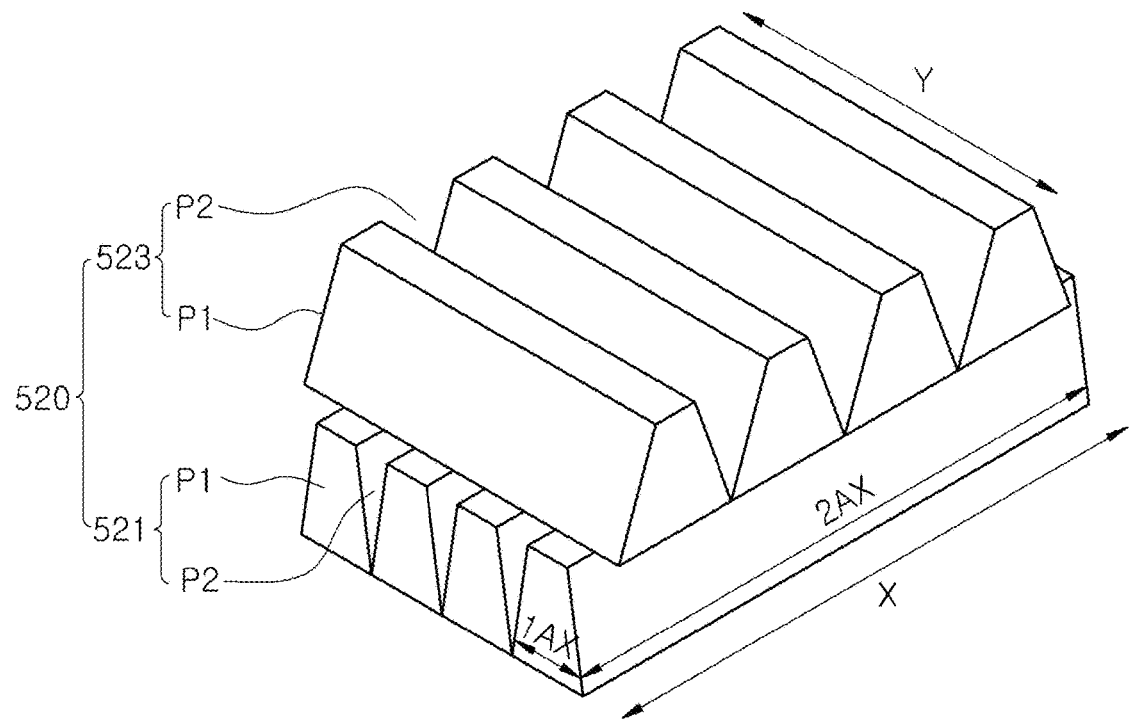
FIG. 17A is a schematic perspective view illustrating a light path adjustment film of a display device according to a fifth embodiment of the present disclosure.
Figure 17B:
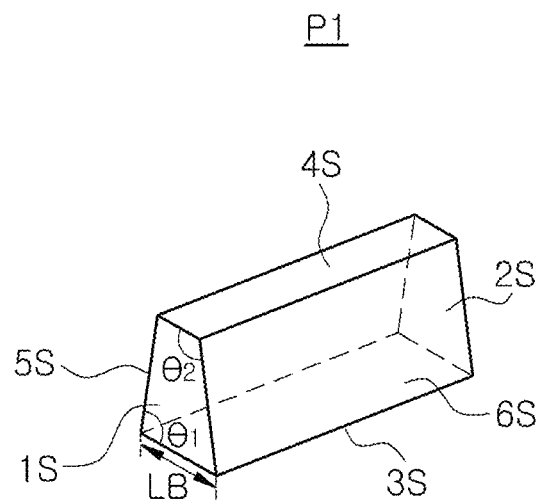
FIG. 17B is a schematic perspective view illustrating a first pattern portion of a light path adjustment film according to the fifth embodiment of the present disclosure.
Figure 17C:
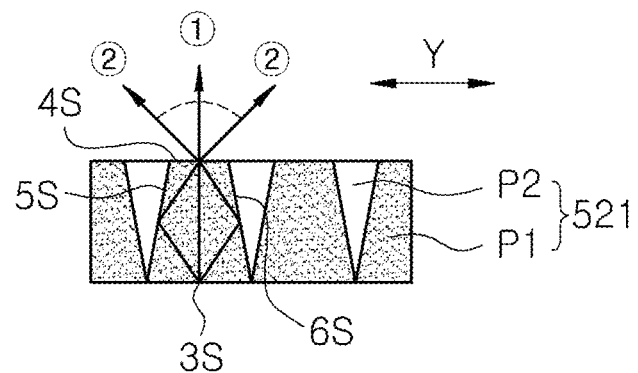
FIG. 17C is a schematic view illustrating a light path of a first pattern layer of a light path adjustment film according to the fifth embodiment of the present disclosure.
Figure 17D:
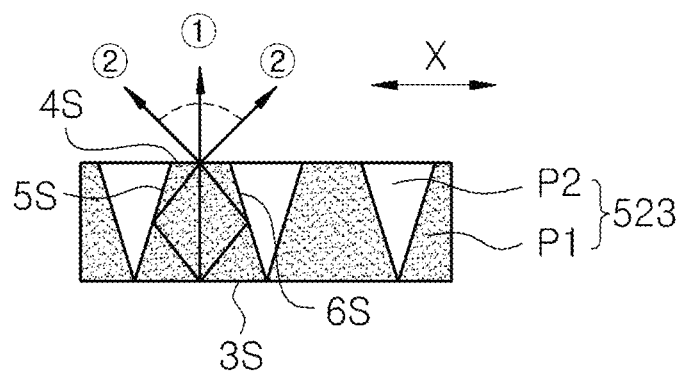
FIG. 17D is a schematic view illustrating a light path of a second pattern layer of a light path adjustment film according to the fifth embodiment of the present disclosure.

FIG. 17A is a schematic perspective view illustrating a light path adjustment film of a display device according to a fifth embodiment of the present disclosure, and FIG. 17B is a schematic perspective view illustrating a first pattern portion of a light path adjustment film according to the fifth embodiment of the present disclosure, FIG. 17C is a schematic view illustrating a light path of a first pattern layer of a light path adjustment film according to the fifth embodiment of the present disclosure, and FIG. 17D is a schematic view illustrating a light path of a second pattern layer of a light path adjustment film according to the fifth embodiment of the present disclosure.

Referring to FIG. 17A, the light path adjustment film 520 on the display panel may include a first pattern layer 521, and a second pattern layer 523 on the first pattern layer 521.

Each of the first pattern layer 521 and the second pattern layer 523 may include a plurality of first pattern portions P1 of a bar shape that have a major axis (or long axis) 2AX and a minor axis (or short axis) 1AX, and a plurality of second pattern portions P2 between the first pattern portions P1.

In this case, the major axis 2AX of the first pattern portion P1 of the first pattern layer 521 may be aligned along a first direction X, and the major axis 2AX of the first pattern portion P1 of the second pattern layer 523 may be aligned along a second direction Y perpendicular to the first direction X.

Referring to FIG. 17B, the first pattern portion P1 in each of the first and second pattern layers 521 and 523 may include a first surface 1S of a trapezoidal shape, a second surface 2S of a trapezoidal shape opposite to the first surface 1S, a third surface 3S connecting a bottom side LB of the first surface 1S and a bottom side LB of the second surface 2S, a fourth surface 4S opposite to the third surface 3S, and first and second slanted surfaces 5S and 6S each connecting the third and fourth surfaces 3S and 4S.

Accordingly, the third surface 3S may be greater than the fourth surface 4S.

The first surface 1S and the second surface 2S may be arranged on the minor axis 1AX. The third surface 3S, the fourth surface 4S, the first slanted surface 5S and the second slanted surface 6S may be arranged on the major axis 2AX.

Accordingly, the first pattern portion P1 may have a truncated quadrangular pyramid shape that has an acute angle θ1 and an obtuse angle θ2 and extends along the major axis 2AX.

The acute angle θ1 may be equal to or more than 70 degrees and less than 90 degrees.

A length of the bottom side LB of each of the first and second surfaces 1S and 2S may be 5 um or less.

In each of the first and second pattern layers 521 and 523, the plurality of first pattern portions P1 are arranged, and the plurality of second pattern portions P2 are arranged between the first pattern portions P1 and have a refractive index less than that of the first pattern portions P1.

The first pattern portions P1 may be arranged such that bottom sides of the first and second slanted surfaces 5S and 6S neighboring each other contact each other.

In other words, the first pattern portions P1 may be arranged with the third surfaces thereof contacting each other.

Since the first pattern layer 521 and the second pattern layer 523 are vertically arranged, a light from the display panel (e.g., 410 of FIG. 12) can be expanded along the first direction X and the second direction Y.

Referring to FIG. 17C, a light from the display panel can be expanded along the second direction Y while passing through the first pattern layer 521.

In detail, light, which is vertically input, from the opening region (e.g., 411a of FIG. 15) of each sub-pixel (e.g., 411 of FIG. 15), to a center portion of the third surface 3S of the first pattern layer 521, is output through the fourth surface 4S of the first pattern layer 521 without refraction (e.g., a light path 1̂).

Light, which is input, from the opening region of each sub-pixel, to the first and second slanted surfaces 5S and 6S via the third surface 3S of the first pattern layer 521, is totally reflected thus adjusted in path and is output to a region, which corresponds to the non-opening region (e.g., 411b of FIG. 15), in the second direction Y, of the sub-pixel, through the fourth surface 4S of the first pattern layer 521 (e.g., a light path 2̂).

Further, while passing through the minute first pattern portion P1 of the first pattern layer 521, the light is diffracted toward a side direction and thus a light output range may be further expanded along the second direction Y.

Referring to FIG. 17D, the light expanded along the second direction Y can be expanded along the first direction X while passing through the second pattern layer 523.

In detail, light, which is vertically input, from the first pattern layer 521, to a center portion of the third surface 3S of the second pattern layer 523, is output through the fourth surface 4S of the second pattern layer 523 without refraction (e.g., a light path 1̂).

Light, which is input, from the first pattern layer 521, to the first and second slanted surfaces 5S and 6S via the third surface 3S of the second pattern layer 523, is totally reflected thus adjusted in path and is output to a region, which corresponds to the non-opening region (e.g., 411b of FIG. 15), in the first direction X, of the sub-pixel, through the fourth surface 4S of the second pattern layer 523 (e.g., a light path 2̂).

Further, while passing through the minute first pattern portion P1 of the second pattern layer 523, the light is diffracted toward a side direction and thus a light output range may be further expanded along the first direction X.

Figure 18:
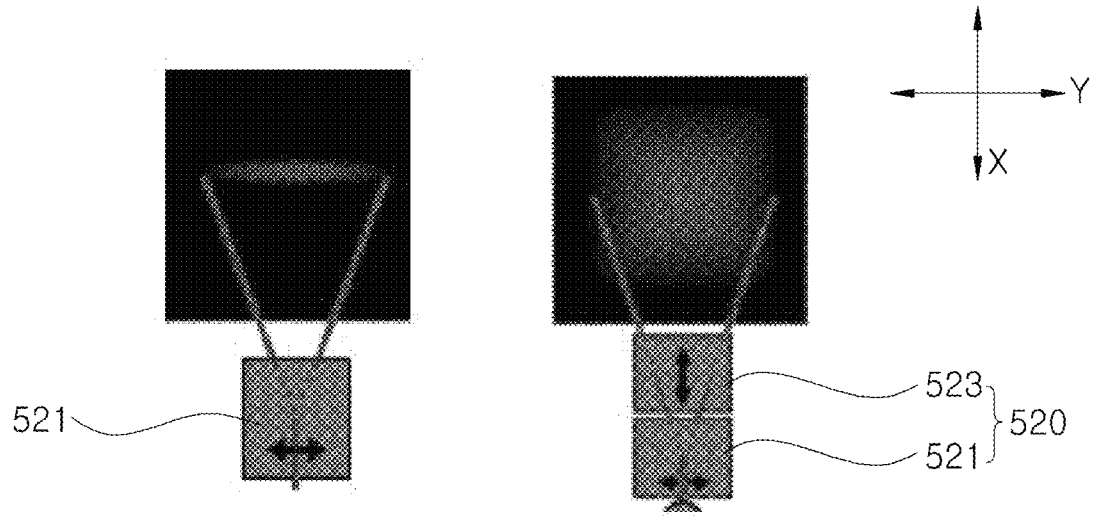
FIG. 18 is a schematic view illustrating light output ranges when passing through the first and second pattern layers in the display device according to the fifth embodiment of the present disclosure.

FIG. 18 is a schematic view illustrating light output ranges when passing through the first and second pattern layers in the display device according to the fifth embodiment of the present disclosure.

Referring to FIG. 18, it is seen that light input to the first pattern layer 521 is expanded along the second direction Y while passing through the first pattern layer 521.

Further, it is seen that the light expanded along the second direction Y by the first pattern layer 521 is expanded along the first direction X while passing through the second pattern layer 523.

In other words, a light from the opening region of the sub-pixel can be expanded along the first and second directions X and Y while passing through the light path adjustment film 520 of this embodiment.

Accordingly, a lattice-like pattern produced at the non-opening regions can be effectively improved.

FIGS. 19A to 19F are views illustrating another examples of light path adjustment films according to the fifth embodiment of the present disclosure.

Figure 19A:
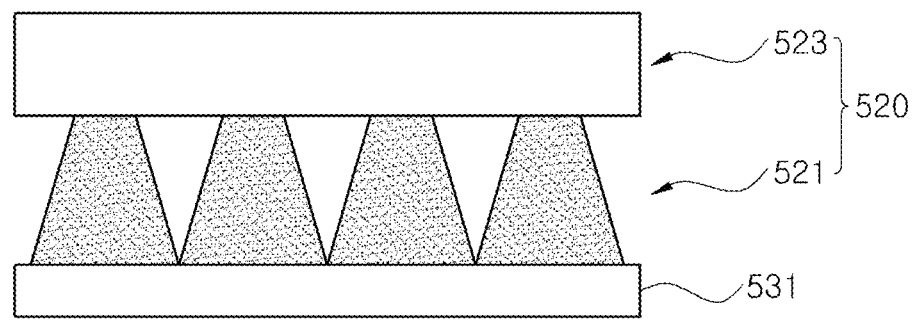
FIGS. 19A to 19F are views illustrating another examples of light path adjustment films according to the fifth embodiment of the present disclosure.

Referring to FIG. 19A, a first base film 531 may be located at a bottom of the light path adjustment film 520.

The first base film 531 supports the light path adjustment film 520. The first base film 531 may contact the display panel and protect the display panel from a moisture or impact, and thus reliability can be achieved.

Figure 19B:
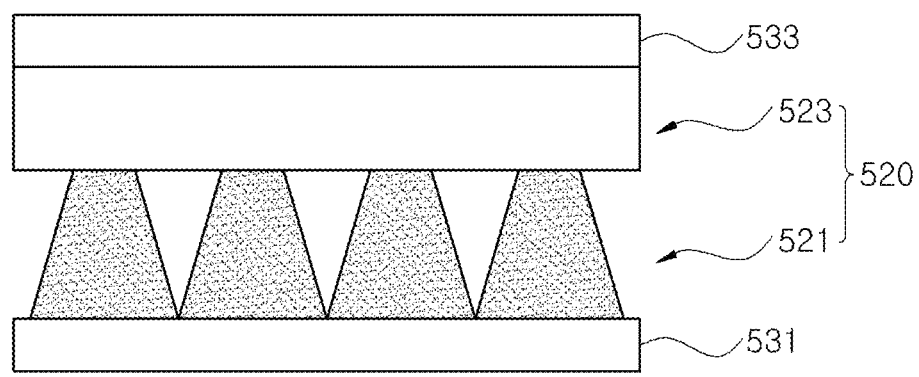

Referring to FIG. 19B, the first base film 531 and the second base film 533 may be located at the bottom and the top of the light path adjustment film 520, respectively.

Figure 19C:
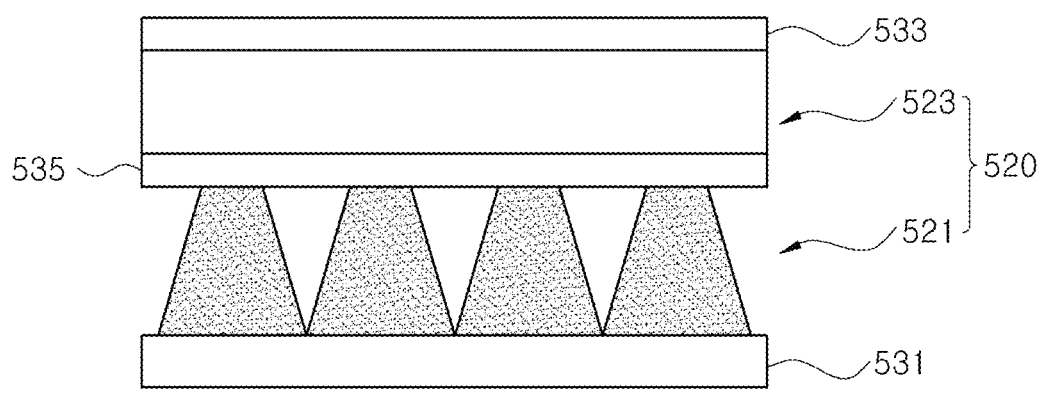

Referring to FIG. 19C, the first base film 531 and the second base film 533 may be attached to the bottom and the top of the light path adjustment film 520, respectively, and a third base film 535 may be located between the first and second pattern layers 521 and 523.

Figure 19D:
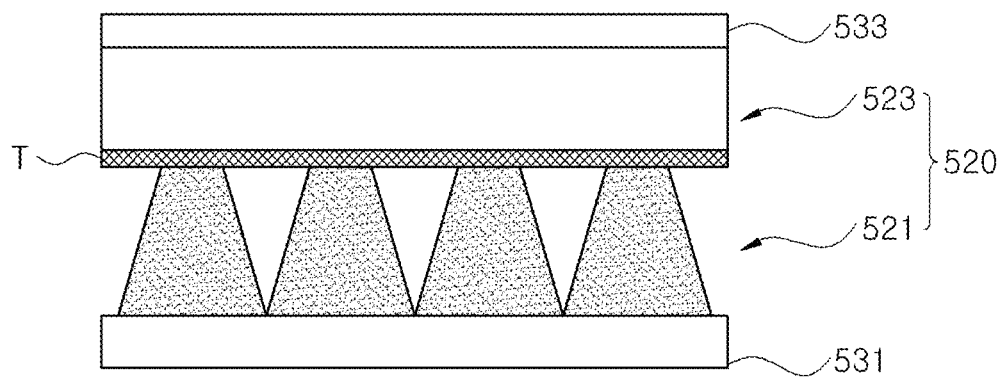

Referring to FIG. 19D, the first base film 531 and the second base film 533 may be attached to the bottom and the top of the light path adjustment film 520, respectively, and an adhesive tape T may be located between the first and second pattern layers 521 and 523.

Each of the first, second and third base films 531, 533 and 535 may be made of a polyethylene terephthalate (PET), polycarbonate (PC), or acryl based material.

The adhesive tape T may be a double-sided adhesive tape coated with an optical adhesive material. Accordingly, the first and second pattern layers 521 and 523 may be firmly fixed.

As described above, the base film 531, 533 or 535 or the adhesive tape T may be arranged in various manners in order to adhere or support the light path adjustment film 520.

Figure 19E:
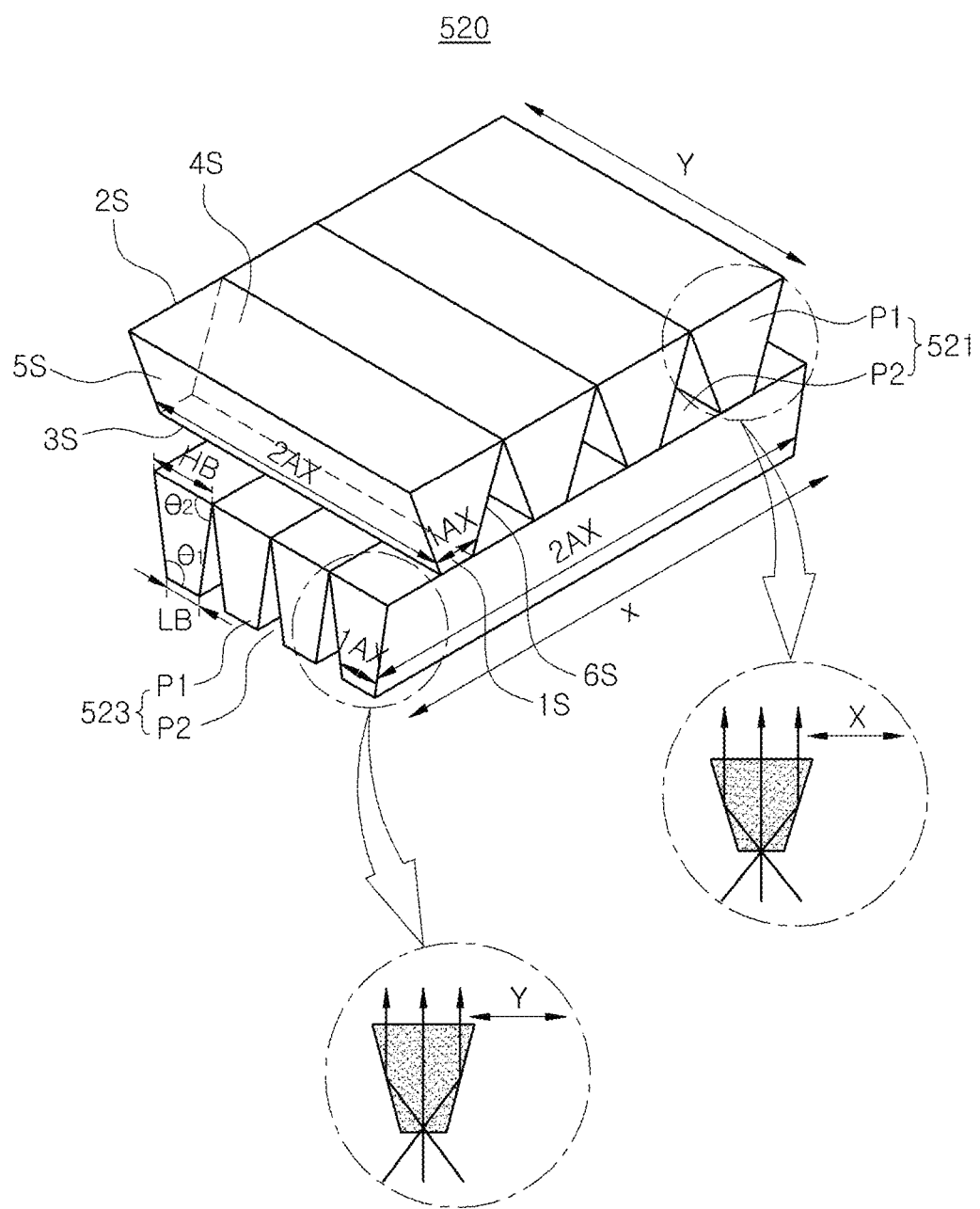

Referring to FIG. 19E, the light path adjustment film 520 may be an inverted arrangement compared with the above examples of this embodiment.

In other words, the second pattern layer 523 may be located on the display panel, and the first pattern layer 521 may be located on the second pattern layer 523.

In this case, each of the first and second pattern layers 521 and 523 may include a plurality of first pattern portions P1 of a bar shape that have a major axis (or long axis) 2AX and a minor axis (or short axis) 1AX, and a plurality of second pattern portions P2 between the first pattern portions P1.

The first pattern portion P1 in each of the first and second pattern layers 521 and 523 may include a first surface 1S of an inverted trapezoidal shape, a second surface 2S of an inverted trapezoidal shape opposite to the first surface 1S, a third surface 3S connecting a bottom side LB of the first surface 1S and a bottom side LB of the second surface 2S, a fourth surface 4S opposite to the third surface 3S, and first and second slanted surfaces 5S and 6S each connecting the third and fourth surfaces 3S and 4S.

Accordingly, the fourth surface 4S may be greater than the third surface 3S.

The first surface 1S and the second surface 2S may be arranged on the minor axis 1AX. The third surface 3S, the fourth surface 4S, the first slanted surface 5S and the second slanted surface 6S may be arranged on the major axis 2AX.

Accordingly, the first pattern portion P1 may have an inverted truncated quadrangular pyramid shape that has an acute angle θ1 and an obtuse angle θ2 and extends along the major axis 2AX.

The acute angle θ1 may be equal to or more than 70 degrees and less than 90 degrees.

A length of a top side HB of each of the first and second surfaces 1S and 2S may be 15 um or less.

In each of the first and second pattern layers 521 and 523, the plurality of first pattern portions P1 are arranged, and the plurality of second pattern portions P2 are arranged between the first pattern portions P1 and have a refractive index less than that of the first pattern portions P1.

Since the first pattern layer 521 and the second pattern layer 523 are vertically arranged, a light from the display panel can be expanded along the first direction X and the second direction Y.

Accordingly, a lattice-like pattern can be effectively improved.

Figure 19F:
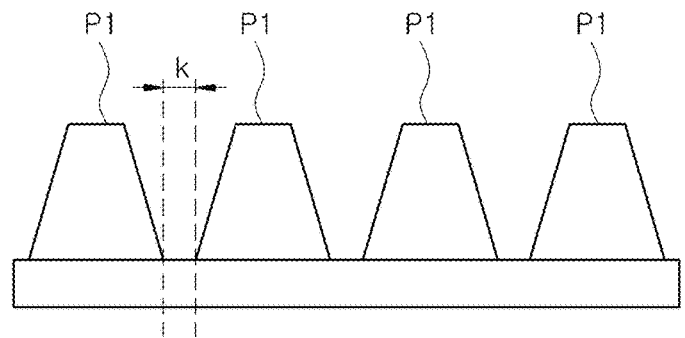

Referring to FIG. 19F, the first pattern portions P1 may be spaced apart from each other.

In other words, the first pattern portions P1 of each of the first and second pattern layer 521 and 523 may be spaced apart at a predetermined distance k from each other.

The distance k between the first pattern portions P1 may be 10 um or less.

As described above, in this embodiment, the light path adjustment film 520 including the first and second pattern layers 521 and 523 vertically arranged are used. Thus, a light from the opening region of each sub-pixel can be expanded along the first and second directions X and Y, and a lattice-like pattern can be effectively reduced.

Figure 20:
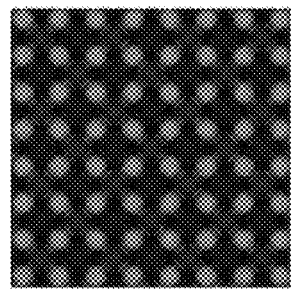
FIG. 20 is a picture of the display device according to the fourth or fifth embodiment of the present disclosure.

FIG. 20 is a picture of the display device according to the fourth or fifth embodiment of the present disclosure.

Referring to FIG. 20, since the display device outputs lights from each sub-pixel (e.g., 411 of FIG. 15) to regions corresponding to the opening region (e.g., 411a of FIG. 15) and the non-opening region (e.g., 411b of FIG. 15) of the sub-pixel via the light path adjustment film (e.g., 420 of FIG. 15 or 520 of FIG. 17), it is seen that a clear image is produced and a lattice-like pattern is reduced.

Figure 21:
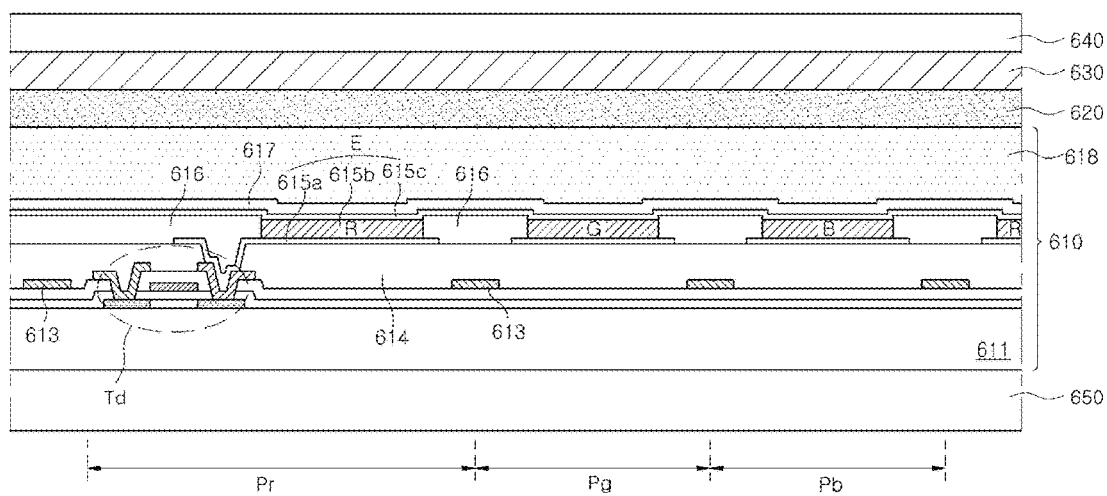
FIG. 21 is a schematic view illustrating an example of a display device according to an embodiment of the present disclosure.

FIG. 21 is a schematic view illustrating an example of a display device according to an embodiment of the present disclosure. By way of example, an organic light emitting display panel is used for the display device 600.

Referring to FIG. 21, the display device 600 may include a heat sink film 650, an organic light emitting diode (OLED) display panel 610 on the heat sink film 650, a light path adjustment film 620 on the OLED display panel 610, a polarizing plate 630 on the light path adjustment film 620, and a cover glass 640 on the polarizing plate 630 and protecting the OLED display panel 610. One of the light path adjustment films of the above embodiments is used as the light path adjustment film 620.

The heat sink film 650 functions to prevent a heat produced in operating the OLED display panel 610 and a rapid reduction of lifetime due to a deterioration of a driving thin film transistor Td. The heat sink film 650 may be configured to have a continuously uneven shape in order to increase a surface area contacting an ambient air.

The OLED display panel 610 may include a first substrate 611 including a plurality of sub-pixels Pr, Pg and Pb, a plurality of organic light emitting diodes E formed at the respective sub-pixels Pr, Pg and Pb, and an encapsulation layer 618 covering the organic light emitting diodes E.

The driving thin film transistor Td is formed in each sub-pixel on an inner surface of the first substrate 611, and a first passivation layer 614 is formed on the driving thin film transistors Td.

The driving thin film transistor Td includes a semiconductor layer, a gate electrode, a source electrode and a drain electrode. An inter-layered insulating layer is formed on the gate electrode, and a data line 613 is formed on the inter-layered insulating layer.

A first electrode 615a is formed on the first passivation layer 614 in each sub-pixel and is connected to the driving thin film transistor Td. Organic light emitting layers 615b emitting red (R), green (G) and blue (B) are formed in the respective sub-pixels Pr, Pg and Pb. A second electrode 615c are formed entirely on the organic light emitting layers 615b.

A bank layer 616 is formed on the first electrode 615a. The bank layer 616 functions to separate the organic light emitting layers 615b emitting (R), green (G) and blue (B) into the respective sub-pixels Pr, Pg and Pb.

The first electrode 615a, the organic light emitting layer 615b and the second electrode 165c in each sub-pixel constitutes the organic light emitting diode E.

A second passivation layer 617 is formed on the second electrode 615c, and the encapsulation layer 618 is formed on the second passivation layer 617.

The encapsulation layer 618 may be formed with a multi-layered structure using an organic layer and/or an inorganic layer on the second passivation layer 617, or may be formed with a face seal on the second passivation layer 617.

The first substrate 611 may be referred to as a lower substrate, a TFT substrate or backplane and may be made of glass or plastic.

The second passivation layer 617 functions to prevent penetration of a moisture or foreign substance from the outside. The encapsulation layer 618 functions to prevent penetration of a moisture or foreign substance from the outside, and to absorb an external impact as well. The above-described structure of the OLED display panel 610 is by way of example, and the OLED display panel 610 may have other structure.

An adhesive material may be coated on the OLED display panel 610, and the light path adjustment film 620 may be attached to the OLED display panel. Accordingly, a path of a light produced by the OLED display panel 610 is expanded to a region that corresponds to the non-opening region (e.g., 411b of FIG. 15), and thus a clear image can be maintained and a lattice-like pattern can be reduced.

The OLED display panel 610 is protected by the light path adjustment film 620, and reliability of the OLED display panel 610 can further rise.

The polarizing plate 630 prevents light, which is produced by the OLED display panel 610, and an external light, which enters the OLED display panel 610 and is reflected in a reflecting material in the OLED display panel 610, causes a mutual interference and a display performance is degraded. In the polarizing plate 630 as a reflection preventing filter, an absorption axis of a polarizer and an optical axis (e.g., an absorption axis) of a retardation film are arranged off-axis to rotate the external light reflected by the reflecting material in the OLED display panel 610.

The light path adjustment film 620 located between the OLED display panel 610 and the polarizing plate 630 is described by way of example. The light path adjustment film 620 may be located at other position, for example, on the polarizing plate 630.

When the display device 600 is applied to a VR device, the cover glass 640 and the polarizing plate 630 may be eliminated because of a structure of the VR device.

Figure 22:
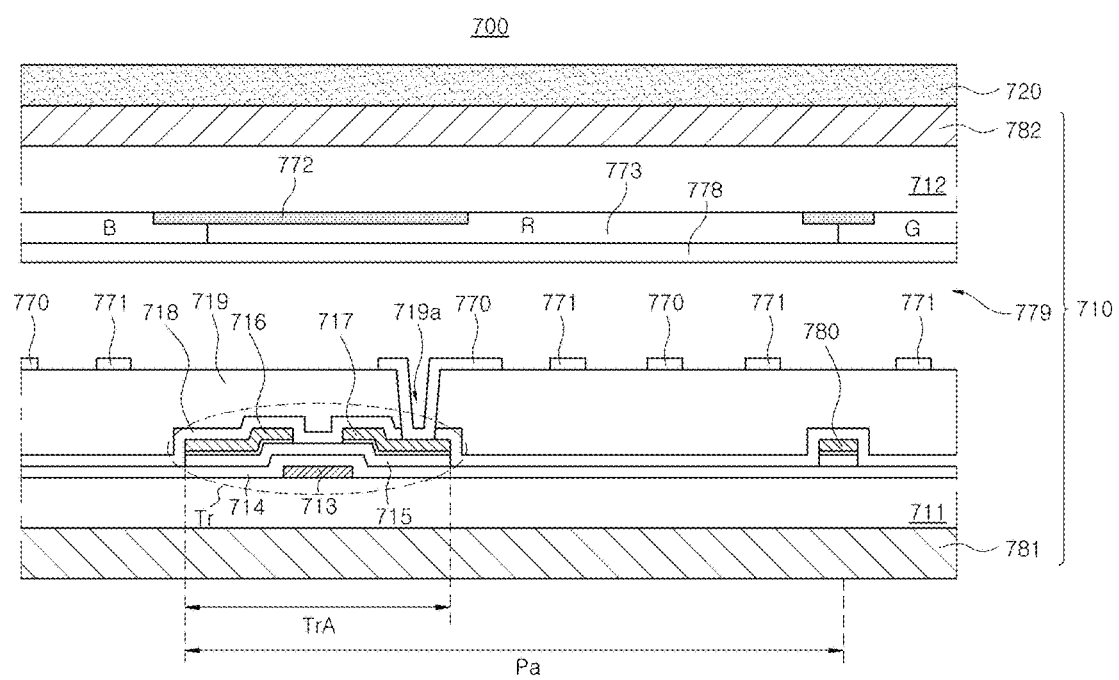
FIG. 22 is a schematic view illustrating an example of a display device according to an embodiment of the present disclosure.

FIG. 22 is a schematic view illustrating an example of a display device according to an embodiment of the present disclosure. By way of example, a liquid crystal display panel is used for the display device.

Referring to FIG. 22, the display device 700 may include a liquid crystal display panel 710 and a light path adjustment film 720 on the liquid crystal display panel 710. One of the light path adjustment films of the above embodiments is used as the light path adjustment film 720.

The liquid crystal display panel 710 may include a first substrate 711, a second substrate 712 and a liquid crystal layer 779 between the first and second substrates 711 and 712.

A plurality of gate lines along a direction are formed on the first substrate 711. A plurality of common lines are formed on the first substrate, and are spaced apart from and parallel with the corresponding gate lines.

A thin film transistor Tr as a switching element is formed in a switching region TrA, and includes a gate electrode 713, a gate insulating layer 714, a semiconductor layer 715, and source and drain electrodes 716 and 717 spaced apart from each other.

A plurality of data lines 780 are formed on the gate insulating layer 714 and cross the plurality of gate lines to define a plurality of sub-pixels Pa. The data line 780 is connected to the source electrode 716.

A first passivation layer 718 made of, for example, an inorganic insulating material is formed on the thin film transistor Tr and the data line 780, and a second passivation layer 719 made of, for example, an organic insulating material are formed on the first passivation layer 718 and has a flat top surface. The first and second passivation layers 718 and 719 have a drain contact hole 719a exposing the drain electrode 717, and a common contact hole exposing the common line.

A plurality of pixel electrodes 770 and a plurality of common electrodes 771 are formed on the second passivation layer 719 in each sub-pixel Pa, and are alternately arranged in the sub-pixel Pa. Each of the pixel electrode 770 and the common electrode 771 is made of a transparent conductive material, for example, ITO or IZO. The pixel electrode 770 is connected to the drain electrode 717 through the drain contact hole 719a, and the common electrode 771 is connected to the common line through the common contact hole.

A black matrix 772 is formed on an inner surface of the second substrate 712, and corresponds to a boundary portion of each sub-pixel and the thin film transistor Tr. A color filter layer 773, which includes red (R), green (G) and blue (B) color filter patterns corresponding to the respective sub-pixels, are formed on the second substrate 712. An edge portion of the color filter pattern may overlap the black matrix 711.

An overcoat layer 778 is formed on the color filter layer 773, and has a flat surface.

First and second polarizing plates 781 and 782 are located on outer surfaces of the first and second substrates 711 and 712. Each of the first and second polarizing plates 781 and 782 transmits light which has a polarized direction parallel with a transmission axis of each of the first and second polarizing plates 781 and 782. Arrangement of the transmission axes of the first and second polarizing plates 781 and 782 and alignment of the liquid crystal molecules determines light transmission. For example, the transmission axes of the first and second polarizing plates 781 and 782 are perpendicular to each other.

The light path adjustment film 720 may be attached on an outer surface of the second polarizing plate 782. Alternatively, the light path adjustment film 720 may be interposed between the second substrate 712 and the second polarizing plate 782. Accordingly, the light path adjustment film 720 expands a path of a light produced by the liquid crystal display panel 710 to a region which corresponds to the non-opening region (e.g., 411b of FIG. 15), and thus the display device 700 which can maintain a clear image and reduce a lattice-like pattern can be achieved.

In this embodiment, the liquid crystal display panel is described by way of example, and other type display panel may be used.

Further, in the above embodiments, the pentile structure is described by way of example, and other structure may be used.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a display panel including a plurality of pixels each having a plurality of sub-pixels; and a
light path adjustment film on the display panel,
wherein the light path adjustment film includes a first base film, and a pattern layer on a surface of the first base film,
wherein the pattern layer includes a plurality of first patterns having a first refractive index, and a plurality of second patterns between the plurality of first patterns and having a second refractive index less than the first refractive index,
wherein each of the plurality of first patterns includes a top surface spaced apart from the display panel and parallel with the display panel, a bottom surface between the top surface and the display panel and overlapping the top surface, and a slanted surface connecting the top surface and the bottom surface,
wherein the bottom surface of each of the plurality of first patterns is wider than the top surface of the first pattern that overlaps the bottom surface,
wherein each of the plurality of first patterns overlaps a corresponding one sub-pixel from the plurality of sub-pixels,
wherein a width of a bottom surface of a first pattern from the plurality of first patterns is wider than a width of an opening region of the sub-pixel that corresponds to the first pattern, and
wherein a width of a top surface of the first pattern is wider than a width of the opening region of the sub-pixel.

2. The device of claim 1, wherein the light path adjustment film further includes a second base film, and the pattern layer is between the first and second base films.

3. The device of claim 1, wherein the plurality of first patterns are spaced apart from each other.

4. The device of claim 3, wherein the bottom surface of each of the plurality first patterns is spaced apart from a bottom surface of an adjacent first pattern such that a gap is formed between the bottom surface of the first pattern and the bottom surface of the adjacent first pattern.

5. The device of claim 1, wherein the first pattern has a truncated polypyramid shape or truncated cone shape.

6. The device of claim 1, wherein the plurality of second patterns comprise air gaps in the pattern layer.

7. The device of claim 1, wherein the bottom surface of each of the plurality of first patterns is in contact with a bottom surface of an adjacent first pattern.

8. A display device comprising:
a display panel including a plurality of pixels each having a plurality of sub-pixels; and a
light path adjustment film on the display panel,
wherein the light path adjustment film includes a first base film, and a pattern layer on a surface of the first base film,
wherein the pattern layer includes a plurality of first patterns having a first refractive index, and a plurality of second patterns between the plurality of first patterns and having a second refractive index less than the first refractive index,
wherein each of the plurality of first patterns includes a top surface spaced apart from the display panel and parallel with the display panel, a bottom surface between the top surface and the display panel and overlapping the top surface, and a slanted surface connecting the top surface and the bottom surface,
wherein the bottom surface of each of the plurality of first patterns is wider than the top surface of the first pattern that overlaps the bottom surface,
wherein each of the plurality of first patterns overlaps a corresponding one sub-pixel from the plurality of pixels,
wherein a width of a bottom surface of a first pattern from the plurality of first patterns is wider than a width of an opening region and non-opening regions of a sub-pixel of a given pixel that corresponds to the first pattern,
wherein the opening region is between the non-opening regions of the sub-pixel of the given pixel, and
wherein a width of a top surface of the first pattern is wider than the width of the opening region of the sub-pixel of the given pixel, and is equal to or less than the non-opening regions of the sub-pixel of the given pixel.

9. The device of claim 8, wherein the plurality of second patterns comprise air gaps in the pattern layer.

10. The device of claim 8, wherein the bottom surface of each of the plurality of first patterns is in contact with a bottom surface of an adjacent first pattern.

11. The device of claim 8, wherein the bottom surface of each of the plurality first patterns is spaced apart from a bottom surface of an adjacent first pattern such that a gap is formed between the bottom surface of the first pattern and the bottom surface of the adjacent first pattern.

12. The device of claim 8, wherein the first pattern has a truncated polypyramid shape or truncated cone shape.

13. A display device comprising:
a display panel including a plurality of pixels each having a plurality of sub-pixels; and a
light path adjustment film on the display panel,
wherein the light path adjustment film includes a first base film, and a pattern layer on a surface of the first base film,
wherein the pattern layer includes a plurality of first patterns having a first refractive index, and a plurality of second patterns between the plurality of first patterns and having a second refractive index less than the first refractive index,
wherein each of the plurality of first patterns includes a top surface spaced apart from the display panel and parallel with the display panel, a bottom surface between the top surface and the display panel and overlapping the top surface, and a slanted surface connecting the top surface and the bottom surface,
wherein the top surface of each of the plurality of first patterns is wider than the bottom surface of the first pattern that overlaps the bottom surface,
wherein a width of a top surface of a first pattern from the plurality of first patterns is wider than a width of an opening region of the sub-pixel that corresponds to the first pattern, and wherein a width of the bottom surface of the first pattern is wider than a width of the opening region of the sub-pixel.

14. The device of claim 13, wherein the light path adjustment film further includes a second base film, and the pattern layer is between the first and second base films.

15. The device of claim 13, wherein the plurality of second patterns comprise air gaps in the pattern layer.

16. The device of claim 1, wherein the bottom surface of each of the plurality of first patterns is in contact with a bottom surface of an adjacent first pattern.

17. The device of claim 13, wherein the bottom surface of each of the plurality first patterns is spaced apart from a bottom surface of an adjacent first pattern such that a gap is formed between the bottom surface of the first pattern and the bottom surface of the adjacent first pattern.

18. A display device comprising:
a display panel including a plurality of pixels each having a plurality of sub-pixels; and a
light path adjustment film on the display panel,
wherein the light path adjustment film includes a first base film, and a pattern layer on a surface of the first base film,
wherein the pattern layer includes a plurality of first patterns having a first refractive index, and a plurality of second patterns between the plurality of first patterns and having a second refractive index less than the first refractive index,
wherein each of the plurality of first patterns includes a top surface spaced apart from the display panel and parallel with the display panel, a bottom surface between the top surface and the display panel and overlapping the top surface, and a slanted surface connecting the top surface and the bottom surface,
wherein the top surface of each of the plurality of first patterns is wider than the bottom surface of the first pattern that overlaps the bottom surface,
wherein each of the plurality of first patterns overlaps a corresponding one sub-pixel from the plurality of sub-pixels,
wherein a width of the top surface of a first pattern from the plurality of first patterns is wider than a width of an opening region of a sub-pixel of a given pixel that corresponds to the first pattern, and
wherein a width of the bottom surface of the first pattern is equal to or less than the width of the opening region and the non-opening regions of the sub-pixel of the given pixel.

19. The device of claim 18, wherein the light path adjustment film further includes a second base film, and the pattern layer is between the first and second base films.

20. The device of claim 18, wherein the plurality of second patterns comprise air gaps in the pattern layer.

21. The device of claim 1, wherein the bottom surface of each of the plurality of first patterns is in contact with a bottom surface of an adjacent first pattern.

22. The device of claim 18, wherein the bottom surface of each of the plurality first patterns is spaced apart from a bottom surface of an adjacent first pattern such that a gap is formed between the bottom surface of the first pattern and the bottom surface of the adjacent first pattern.

* * * * *